United States Patent
Choi et al.

(10) Patent No.: US 9,735,090 B2
(45) Date of Patent: Aug. 15, 2017

(54) INTEGRATED CIRCUIT DEVICES HAVING THROUGH-SILICON VIAS AND METHODS OF MANUFACTURING SUCH DEVICES

(71) Applicants: Ju-il Choi, Seongnam-si (KR); Atsushi Fujisaki, Seongnam-si (KR); Byung-Iyul Park, Seoul (KR); Ji-soon Park, Suwon-si (KR); Joo-hee Jang, Hwaseong-si (KR); Jeong-gi Jin, Seoul (KR)

(72) Inventors: Ju-il Choi, Seongnam-si (KR); Atsushi Fujisaki, Seongnam-si (KR); Byung-Iyul Park, Seoul (KR); Ji-soon Park, Suwon-si (KR); Joo-hee Jang, Hwaseong-si (KR); Jeong-gi Jin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 5 days.

(21) Appl. No.: 14/873,453

(22) Filed: Oct. 2, 2015

(65) Prior Publication Data
US 2016/0099201 A1 Apr. 7, 2016

(30) Foreign Application Priority Data
Oct. 6, 2014 (KR) ........................ 10-2014-0134474

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76898* (2013.01); *H01L 24/00* (2013.01);
(Continued)

(58) Field of Classification Search
CPC .......... H01L 23/5226; H01L 21/76834; H01L 21/76831; H01L 21/76802; H01L 23/528;
(Continued)

(56) References Cited

U.S. PATENT DOCUMENTS

| | | | |
|---|---|---|---|
| 6,429,531 B1 | 8/2002 | Mistry et al. | |
| 8,466,059 B2 * | 6/2013 | Chang | H01L 21/6835 257/E21.577 |

(Continued)

FOREIGN PATENT DOCUMENTS

| | | |
|---|---|---|
| JP | 2000-150518 | 5/2000 |
| JP | 2000-173949 | 6/2000 |

(Continued)

OTHER PUBLICATIONS

Kohl, Paul A., "Electrodeposition of Gold," Modern Electroplating, 4th Edition, 2010, pp. 115-130.

*Primary Examiner* — Bac Au
(74) *Attorney, Agent, or Firm* — Myers Bigel, P.A.

(57) ABSTRACT

An integrated circuit device includes a semiconductor structure, a through-silicon-via (TSV) structure that penetrates through the semiconductor structure and a connection terminal connected to the TSV structure. A metal capping layer includes a flat capping portion that covers the bottom surface of the connection terminal and a wedge-shaped capping portion that is integrally connected to the flat capping portion and that partially covers a side wall of the connection terminal. The metal capping layer may be formed by an electroplating process in which the connection terminal is in contact with a metal strike electroplating solution while a pulse-type current is applied.

20 Claims, 22 Drawing Sheets

(51) Int. Cl.
*H01L 23/00* (2006.01)
*H01L 23/532* (2006.01)

(52) U.S. Cl.
CPC .. *H01L 23/53223* (2013.01); *H01L 23/53238* (2013.01); *H01L 23/53266* (2013.01); *H01L 2224/16145* (2013.01); *H01L 2224/16225* (2013.01); *H01L 2224/32225* (2013.01); *H01L 2224/73204* (2013.01); *H01L 2924/15311* (2013.01); *H01L 2924/181* (2013.01); *H01L 2924/18161* (2013.01)

(58) Field of Classification Search
CPC ..... H01L 2224/73204; H01L 21/76816; H01L 21/76879; H01L 21/76877; H01L 23/481; H01L 23/485; H01L 21/76804; H01L 21/76883
See application file for complete search history.

(56) References Cited

U.S. PATENT DOCUMENTS

| | | | | |
|---|---|---|---|---|
| 8,513,119 B2* | 8/2013 | Chang | ............... | H01L 21/6835 257/E21.577 |
| 9,257,413 B2* | 2/2016 | Yang | .................. | H01L 25/0657 |
| 2006/0118952 A1 | 6/2006 | Suzuki et al. | | |
| 2012/0228780 A1* | 9/2012 | Kim | ........................ | H01L 23/36 257/774 |
| 2013/0134603 A1* | 5/2013 | Lee | ........................ | H01L 24/03 257/774 |
| 2013/0313690 A1* | 11/2013 | Miyazaki | .............. | H01L 23/481 257/621 |
| 2014/0048952 A1* | 2/2014 | Lee | .................... | H01L 23/5384 257/774 |
| 2014/0057430 A1* | 2/2014 | Lee | .................. | H01L 21/76898 438/613 |
| 2014/0131841 A1 | 5/2014 | Tseng et al. | | |
| 2014/0179103 A1* | 6/2014 | Kang | ....................... | H01L 21/7684 438/667 |
| 2015/0137388 A1* | 5/2015 | Kim | ..................... | H01L 23/481 257/774 |

FOREIGN PATENT DOCUMENTS

| | | |
|---|---|---|
| JP | 2001-237337 | 8/2001 |
| JP | 2003-183884 | 7/2003 |
| JP | 2005-191131 | 7/2005 |
| KR | 1020090091441 A | 8/2009 |
| KR | 1020120116542 A | 10/2012 |

* cited by examiner

INTEGRATED CIRCUIT DEVICES HAVING THROUGH-SILICON VIAS AND METHODS OF MANUFACTURING SUCH DEVICES

CROSS-REFERENCE TO RELATED APPLICATION

This application claims priority under 35 U.S.C. §119 from Korean Patent Application No. 10-2014-0134474, filed on Oct. 6, 2014 in the Korean Intellectual Property Office, the disclosure of which is incorporated herein in its entirety by reference.

BACKGROUND

The inventive concepts relate to integrated circuit devices and, more particularly, to integrated circuit devices that include at least one through-silicon-via (TSV) structure and to methods of manufacturing such devices.

As three-dimensional (3D) packages that include a plurality of semiconductor chips are developed, technology for ensuring reliability in a connection structure using a TSV, in which an electrical connection is formed vertically by penetrating through a substrate or a die, is necessary.

SUMMARY

The inventive concepts provide integrated circuit devices that include through-silicon-via (TSV) connection structures that may exhibit stable and reliable operations, as well as methods of fabricating such integrated circuit devices.

According to an aspect of the inventive concepts, integrated circuit devices are provided that include: a semiconductor structure; a through-silicon-via (TSV) structure that extends in a first direction and that penetrates through the semiconductor structure; a connection terminal on the semiconductor structure, the connection terminal including an upper surface that is electrically connected to the TSV structure, a bottom surface that is opposite the upper surface, and a side wall that extends between the bottom surface and the upper surface; and a metal capping layer that includes a flat capping portion that covers the bottom surface of the connection terminal, and a wedge-shaped capping portion that is integrally connected to the flat capping portion and that partially covers the side wall of the connection terminal.

The side wall of the connection terminal has a first length and a side wall of the wedge-shaped capping portion that partially covers the side wall of the connection terminal has a second length that is less than or equal to half the first length. The second length may be in a range of about 0.1 μm to about 3 μm.

The wedge-shaped capping portion may have a thickness that decreases with increasing distance from the bottom surface of the connection terminal.

The flat capping portion of the metal capping layer may have a thickness in the first direction of about 0.05 μm to about 0.5 μm.

The portion of the flat capping portion of the metal capping layer that contacts the bottom surface of the connection terminal may have a thickness variation within ±3%.

The metal capping layer may comprise a precious metal such as, for example, gold (Au).

The connection terminal may comprise a conductive pad, a solder ball, a solder bump, or a redistribution conductive layer. The connection terminal may comprise Ni, Cu, Al, or a combination thereof.

The integrated circuit device may further include a metal layer between the TSV structure and the connection terminal. The metal layer may comprise Ti, Cu, Ni, Au, NiV, NiP, TiNi, TiW, TaN, Al, Pd, CuCr, or a combination thereof.

The semiconductor structure may include a substrate and an interlayer insulating layer that covers the substrate, and the TSV structure penetrates through the substrate and the interlayer insulating layer.

The semiconductor structure may include a substrate and an interlayer insulating layer that covers the substrate, and the TSV structure may penetrate through the substrate without fully penetrating the interlayer insulating layer.

The semiconductor structure may include a substrate, an interlayer insulating layer covering the substrate, and an inter-metal insulating layer that covers the interlayer insulating layer, and the TSV structure penetrates through the substrate, the interlayer insulating layer, and the inter-metal insulating layer.

The integrated circuit device may further include a solder structure that surrounds the metal capping layer on the connection terminal, wherein the solder structure may extend to cover a portion of the side wall of the connection terminal that is not covered by the wedge-shaped capping portion, while surrounding the wedge-shaped capping portion.

According to an aspect of the inventive concepts, there is provided a method of manufacturing an integrated circuit device, the method includes: forming a via hole in a semiconductor structure; forming a through-silicon-via (TSV) structure in the via hole; forming a conductive layer on the semiconductor structure that is electrically connected to the TSV structure; forming a connection terminal on the conductive layer; and forming a metal capping layer on the connection terminal by performing an electroplating process while applying a pulse-type current using the conductive layer as an electrode.

The metal capping layer may include a flat capping portion that covers a bottom surface of the connection terminal, and a wedge-shaped capping portion that is integrally connected to the flat capping portion and that partially covers a side wall of the connection terminal.

Forming the metal capping layer may comprise repeatedly applying a current via an electroplating solution during an ON-time period Ton, and not applying the current during an OFF-time period Toff, at least twice.

The current that is applied via the electroplating solution during the ON-time period may have a current density of about 0.05 A/dm$^2$ to about 3 A/dm$^2$.

A duty cycle of the ON-time period and the OFF-time period {Ton/(Ton+Toff)} may be set as 5% to 95%.

The Connection Terminal May be Formed Via an Electroplating Process.

The method may further include using a rinse solution to clean the connection terminal, wherein forming the metal capping layer may include: putting the connection terminal in contact with a metal strike electroplating solution in a state where the rinse solution remains on the connection terminal; and plating a surface of the connection terminal with precious metal using the metal strike electroplating solution.

The metal capping layer may be formed using a metal strike electroplating solution. The metal strike electroplating solution may contain Au ions of 2 g/L or less.

The metal strike electroplating solution may include an electrolyte having SO$_3$-group, and the electrolyte may be contained in the metal strike electroplating solution in an amount of about 10 g/L to about 20 g/L.

According to an aspect of the inventive concepts, there is provided a method of manufacturing an integrated circuit device, the method including: forming a via hole in a semiconductor structure; forming a through-silicon-via (TSV) structure in the via hole; forming a conductive layer on the semiconductor structure that is electrically connected to the TSV structure; forming a mask pattern on the conductive layer, wherein the mask pattern has an opening having a first height that exposes a part of a bottom surface of the conductive layer; forming a connection terminal on the exposed bottom surface of the conductive layer within the opening via an electroplating process, wherein the connection terminal has a second height that is less than the first height; and then forming a metal capping layer on the connection terminal within the opening in-situ with the forming of the connection terminal, wherein forming the metal capping layer may include putting the connection terminal in contact with a metal strike electroplating solution while applying a pulse-type current using the conductive layer as an electrode.

The metal capping layer may comprise a flat capping portion that covers a bottom surface of the connection terminal and a wedge-shaped capping portion that is integrally connected to the flat capping portion and that is formed in a wedge-shaped space between a side wall of the connection terminal and a side wall of the mask pattern within the opening.

Forming the metal capping layer may include: forming a flat capping portion that covers a bottom surface of the connection terminal; and forming a wedge-shaped capping portion by forming metal seeds in the wedge-shaped space between the side wall of the connection terminal and the side wall of the mask pattern while the flat capping portion is formed.

The method may further include using a rinse solution to rinse the connection terminal, wherein forming the metal capping layer in-situ with the forming of the connection terminal may include contacting the connection terminal to the metal strike electroplating solution in a state where the rinse solution remains on the connection terminal.

Forming the metal capping layer may include applying current via the metal strike electroplating solution during an ON-time period Ton and not applying the current during an OFF-time period Toff.

In yet another aspect of the inventive concepts, integrated circuit devices are provided that include: a semiconductor structure that has a through-silicon-via (TSV) structure; a connection terminal that is electrically connected to the TSV structure that has a bottom surface, an upper surface that is opposite the bottom surface, and a side wall that extends between the bottom surface and the upper surface; and a metal capping layer that includes a flat capping portion that is on the bottom surface of the connection terminal and a wedge-shaped capping portion that is integrally connected to the flat capping portion and that extends onto the side wall of the connection terminal.

The integrated circuit device may also include a metal layer between the TSV structure and the connection terminal.

The wedge-shaped capping portion may cover no more than half the length of the side wall of the connection terminal.

The connection terminal may be on a bottom surface of the metal layer and the metal capping layer may be on a bottom surface of the connection terminal, and the portion of the flat capping portion of the metal capping layer that contacts the bottom surface of the connection terminal may have a thickness variation within ±3%.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Figure 1:
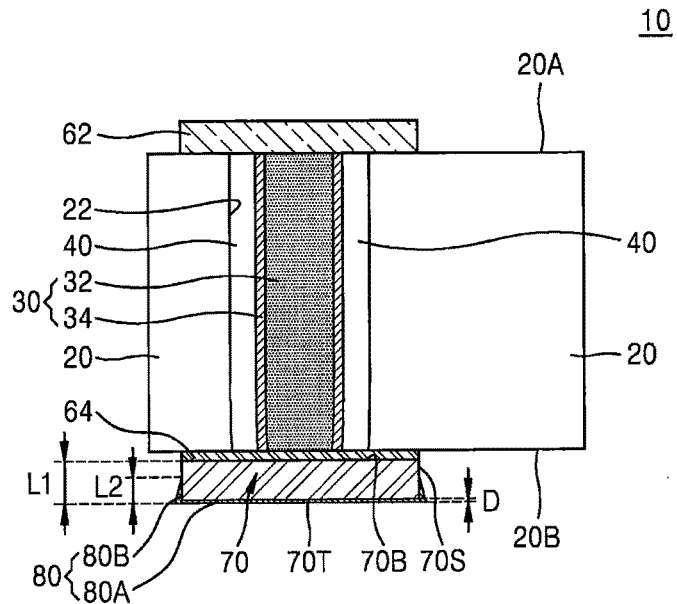
FIG. 1 is a cross-sectional view of an integrated circuit device according to an exemplary embodiment of the inventive concepts.

The inventive concept are described below with reference to exemplary embodiments thereof. Like reference numerals in the drawings denote like elements, and thus their description will be omitted.

The inventive concepts may be embodied in many different forms and should not be construed as limited to the exemplary embodiments set forth herein. Rather, these embodiments are provided so that this disclosure will be thorough and complete, and will fully convey the scope of the inventive concepts to those skilled in the art. In the drawings, lengths and sizes of layers and regions may be exaggerated for clarity.

Also, though terms like 'first' and 'second' are used to describe various elements, components, regions and/or layers in various embodiments of the inventive concepts, the elements, components, regions and/or layers should not be limited by these terms. These terms are only used to distinguish one element, component, region and/or layer from another element, component, region and/or layer. Thus, a first element, component, region or layer discussed below could be termed a second element, component, region or layer without departing from the teachings of the inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be appreciated that changes may be made to the example embodiments that are described below without departing from the scope of the inventive concepts. For example, two processes that are described below as being carried out sequentially may be performed at substantially the same time or may be performed in an order opposite to the order to be described.

Additionally, variations from the shapes of the illustrations which result from, for example, manufacturing techniques and/or tolerances, are to be expected. Thus, embodiments of the inventive concepts should not be construed as limited to the particular shapes of regions illustrated herein but are to include deviations in shapes that result, for example, from manufacturing. As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view of an integrated circuit device 10 according to an embodiment of the inventive concepts.

Referring to FIG. 1, the integrated circuit device 10 includes a semiconductor structure 20 and a through-silicon-via (TSV) structure 30 that penetrates through the semiconductor structure 20 through a via hole 22 formed in the semiconductor structure 20. A via insulating layer 40 is disposed between the semiconductor structure 20 and the TSV structure 30.

The TSV structure 30 includes a conductive plug 32 that penetrates through the semiconductor structure 20, and a conductive barrier layer 34 that surrounds the conductive plug 32. The conductive barrier layer 34 may comprise a cylinder that surrounds the conductive plug 32.

In one or more exemplary embodiments, the conductive plug 32 of the TSV structure 30 may include Cu or W. For example, the conductive plug 32 may comprise Cu, CuSn, CuMg, CuNi, CuZn, CuPd, CuAu, CuRe, CuW, W, or a W alloy, but is not limited thereto.

In one or more exemplary embodiments, the conductive barrier layer 34 may include at least one material selected from the group consisting of Ti, TiN, Ta, TaN, Ru, Co, Mn, WN, Ni, and NiB.

In some embodiments, the conductive barrier layer 34 and the conductive plug 32 may be formed by a physical vapor deposition (PVD) process or a chemical vapor deposition (CVD) process, but are not limited thereto.

The via insulating layer 40 may comprise an oxide layer, a nitride layer, a carbide layer, a polymer, or a combination thereof. The via insulating layer 40 may be formed by, for example, a CVD process. The via insulating layer 40 may have a thickness of about 1000 Å to about 2000 Å. In example embodiments, the via insulating layer 40 may be formed as a high aspect ratio process (HARP) oxide layer based on ozone/tetra-ethyl ortho-silicate ($O_3$/TEOS) formed by a sub-atmospheric CVD process.

The semiconductor structure 20 may comprise, for example, a semiconductor substrate such as a silicon substrate. The TSV structure 30 may have a side wall that is surrounded by the semiconductor substrate.

The semiconductor structure 20 may also include an interlayer insulating layer that covers the semiconductor substrate. The TSV structure 30 may be formed through the semiconductor substrate and the interlayer insulating layer.

In another exemplary embodiment, if the semiconductor structure 20 includes the semiconductor substrate and an interlayer insulating layer that covers the semiconductor substrate, the TSV structure 30 may only penetrate the semiconductor substrate without penetrating the interlayer insulating layer.

In another exemplary embodiment, the semiconductor structure 20 may include a semiconductor substrate, an interlayer insulating layer that covers the semiconductor substrate, and an inter-metal insulating layer that covers the interlayer insulating layer. In some embodiments, the TSV structure 30 may penetrate through the semiconductor substrate, the interlayer insulating layer, and the inter-metal insulating layer.

A first conductive layer 62 is formed on a first surface 20A of the semiconductor structure 20 and may directly contact a first end of the TSV structure 30. A second conductive layer 64 may directly contact the other end of the TSV structure 30. A connection terminal 70 may be electrically is connected to a second end of the TSV structure 30 that is opposite the first end via the second conductive layer 64. A metal capping layer 80 partially covers the connection terminal 70. The second conductive layer 64, the connection terminal 70 and the metal capping layer 80 are formed on a second surface 20B of the semiconductor structure 20.

The first and second conductive layers 62 and 64 may both be formed of metal.

In some embodiments, the first conductive layer 62 may be formed of Al.

The second conductive layer 64 forms an under bump metallization (UBM) layer. The second conductive layer 64 may include layers of various compositions according to materials forming the connection terminal 70. In some embodiments, the second conductive layer 64 may be formed of Ti, Cu, Ni, Au, NiV, NiP, TiNi, TiW, TaN, Al, Pd, CuCr, or a combination thereof. For example, the second conductive layer 64 may be formed as a stacked structure of Cr/Cu/Au, a stacked structure of Cr/CrCu/Cu, TiWCu compound, a stacked structure of TiWCu/Cu, a stacked structure of Ni/Cu, a stacked structure of NiV/Cu, a stacked structure of Ti/Ni, a stacked structure of Ti/NiP, TiWNiV compounds, a stacked structure of Al/Ni/Au, a stacked structure of Al/NiP/Au, a stacked structure of Ti/TiNi/CuNi compound, a stacked structure of Ti/Ni/Pd, a stacked structure of Ni/Pd/Au, or a stacked structure of NiP/Pd/Au.

The connection terminal 70 may comprise, for example, a conductive pad, a solder ball, a solder bump or a redistribution conductive layer. The connection terminal 70 may include an upper surface 70B that is connected to the second end of the TSV structure 30 via the second conductive layer 64, a lower surface 70T that is opposite to the upper surface 70B, and side walls 70S that extend between the upper surface 70B and the lower surface 70T. The connection terminal 70 may be formed of Ni, Cu, Al, or a combination thereof, but is not limited thereto. The connection terminal 70 may have various shapes and may have, for example, a circular cross-section, a rectangular cross-section, an oblong cross-section etc. where the cross-section is taken in a plane that is perpendicular to a longitudinal axis of the TSV structure. The connection terminal 70 may have multiple distinct side walls 70S or may have a continuous side wall 70S. A continuous side wall 70S (e.g., a cylindrical side wall) may be viewed as comprising at least two side walls 70S that are continuous with each other (i.e., two side walls that each extend half way around the cylinder).

The metal capping layer 80 includes a flat capping portion 80A that covers the lower surface 70T of the connection terminal 70, and wedge-shaped capping portions 80B that are integrally connected to the flat capping portion 80A to cover a portion of the side walls 70S of the connection terminal 70.

Each side wall 70S of the connection terminal 70 may extend from the upper surface 70B to the lower surface 70T of the connection terminal 70 to have a first length L1 which corresponds to a thickness of the connection terminal 70. Each wedge-shaped capping portion 80B of the metal capping layer 80 may extend to partially cover a respective side wall 70S of the connection terminal 70 and may have a second length L2 that is half the first length L1 or less. Thus, the wedge-shaped capping portions 80 may not extend to the upper surface 70B of the connection terminal 70. In some embodiments, the second length L2 may be about 0.1 µm to about 3 µm, but is not limited thereto.

The wedge-shaped capping portions 80B of the metal capping layer 80 may each have a thickness that decreases with increasing distance from the lower surface 70T of the connection terminal 70.

The flat capping portion 80A of the metal capping layer 80 may have a thickness of about 0.05 µm to about 0.5 µm from the lower surface 70T of the connection terminal 70. The whole portion of the flat capping portion 80A that directly contacts the lower surface 70T of the connection terminal 70 may have a thickness variation of ±3%.

In some embodiments, the metal capping layer 80 may be formed of precious metal such as, for example, Au.

Figure 2:
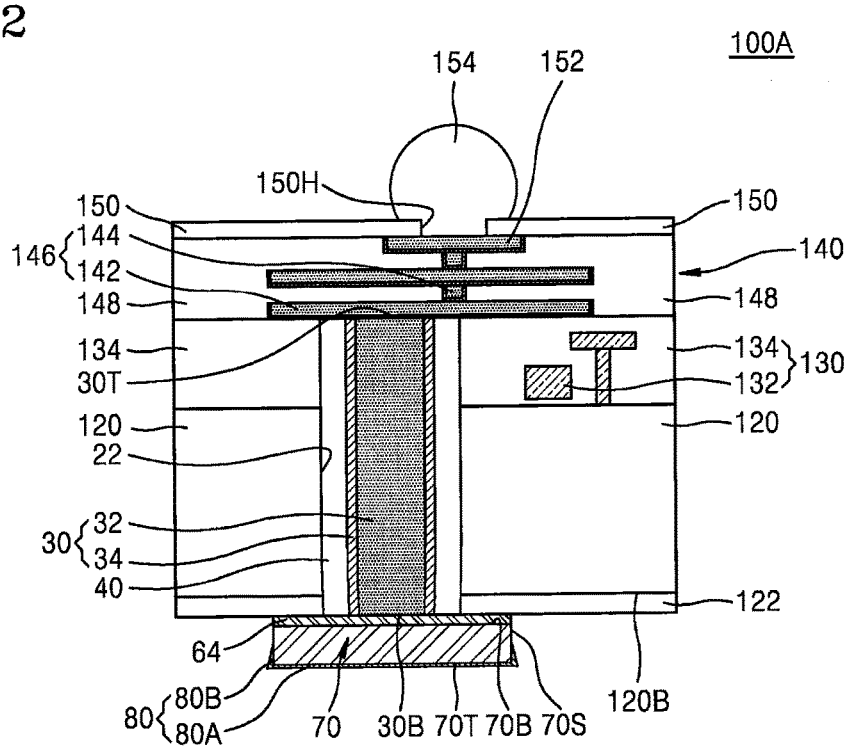
FIG. 2 is a cross-sectional view of an integrated circuit device according to another exemplary embodiment of the inventive concepts.

FIG. 2 is a cross-sectional view of an integrated circuit device 100A according to another exemplary embodiment of the inventive concepts. In FIG. 2, like reference numerals as those of FIG. 1 denote the same elements, and descriptions thereof will be omitted.

The integrated circuit device 100A includes a substrate 120, a front-end-of-line (FEOL) structure 130, and a back-end-of-line (BEOL) structure 140. The TSV structure 30 is formed in the via hole 22 that penetrates through the substrate 120 and the FEOL structure 130. The via insulating layer 40 is between the substrate 120 and the TSV structure 30, and between the FEOL structure 130 and the TSV structure 30.

The TSV structure 30 includes the conductive plug 32 that penetrates through the substrate 120 and the FEOL structure 130, and the conductive barrier layer 34 that surrounds the conductive plug 32.

The substrate 120 may be a semiconductor wafer. In at least one exemplary embodiment, the substrate 120 is formed of silicon (Si). In other embodiments, the substrate 120 may include a semiconductor such as germanium (Ge), or a compound semiconductor such as silicon carbide (SiC), gallium arsenide (GaAs), indium arsenide (InAs), or indium phosphide (InP). In still other embodiments, the substrate 120 may have a silicon on insulator (SOI) structure. For example, the substrate 120 may include a buried oxide (BOX) layer. In some embodiments, the substrate 120 may include a conductive region such as, for example, a well doped with impurities or a structure doped with impurities. Also, the substrate 120 may have various device isolation structures, for example, a shallow trench isolation (STI) structure. A bottom surface 120B of the substrate 120 is covered by a lower insulating layer 122. The lower insulating layer 122 may comprise, for example, a silicon oxide layer, a silicon nitride layer, a polymer, or a combination thereof.

The FEOL structure 130 may include a plurality of individual devices 132 and an interlayer insulating layer 134. The individual devices 132 may include various microelectronic devices such as, for example, a metal-oxide-semiconductor field effect transistor (MOSFET), system large scale integration (LSI), an image sensor such as a complementary MOS imaging sensor (CIS), a micro-electro-mechanical system (MEMS), an active device, and a passive device. The individual devices 132 may be electrically connected to conductive regions of the substrate 120. The individual devices 132 may be electrically isolated from other adjacent individual devices 132 by the interlayer insulating layer 134.

The BEOL structure 140 may have a multi-layered wiring structure 146 that includes a plurality of metal wiring layers 142 and a plurality of contact plugs 144. The multi-layered wiring structure 146 may be electrically connected to the TSV structure 30.

In some embodiments, the BEOL structure 140 may have other multi-layered wiring structures, each including a plurality of metal wiring layers and a plurality of contact plugs, on another region of the substrate 120. The BEOL structure 140 may include the plurality of wiring structures that connect the individual devices included in the FEOL structure 130 to other wires. The multi-layered wiring structures 146 and the other multi-layered wiring structures included in the BEOL structure 140 may be insulated from each other by an inter-metal insulating layer 148. In some embodiments, the BEOL structure 140 may further include a seal ring (not shown) that protects the wiring structures and other structures under the wiring structures against external shock or moisture.

An upper surface 30T of the TSV structure 30 that penetrates through the substrate 120 and the FEOL structure 130 may be physically and electrically connected to the metal wiring layer 142 of the multi-layered wiring structure 146 that is included in the BEOL structure 140.

An upper insulating layer 150 is formed on the inter-metal insulating layer 148. The upper insulating layer 150 may comprise, for example, a silicon oxide layer, a silicon nitride layer, a polymer, or a combination thereof. A hole 150H that exposes a bonding pad 152 that is connected to the multi-layered wiring structure 146 is formed in the upper insulating layer 150. The bonding pad 152 may be physically and electrically connected to an upper connection terminal 154 through the hole 150H.

A bottom surface 30B of the TSV structure 30 is covered by a second conductive layer 64. The connection terminal 70 may be electrically connected to the TSV structure 30 through the second conductive layer 64. Some parts of the lower surface 70T and the side walls 70S of the connection terminal 70 are covered by the metal capping layer 80.

The upper connection terminal 154 and the connection terminal 70 are not limited to the examples shown in FIG. 2, and may comprise, for example, any of a conductive pad, a solder ball, a solder bump, or a redistribution conductive layer. In some embodiments of the inventive concepts, the upper connection terminal 154 may be omitted.

The BEOL structure 140, the upper connection terminal 154, the second conductive layer 64, the connection terminal 70, and the metal capping layer 80 may be formed after the TSV structure 30 is formed.

Figure 3:
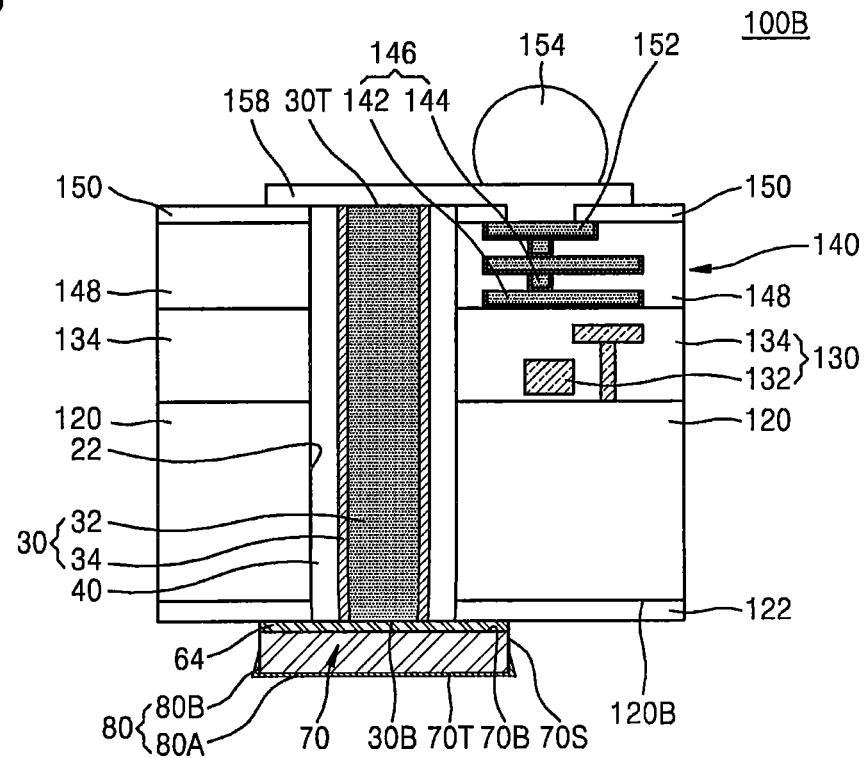
FIG. 3 is a cross-sectional view of an integrated circuit device according to yet another exemplary embodiment of the inventive concepts.

FIG. 3 is a cross-sectional view of an integrated circuit device 100B according to another exemplary embodiment of the inventive concepts. In FIG. 3, like reference numerals as those of FIGS. 1 and 2 denote the same elements, and descriptions thereof will be omitted.

In the integrated circuit device 100B, the TSV structure 30 may be formed after the FEOL structure 130 and the BEOL structure 140 are formed. Accordingly, the TSV structure 30 is formed through the substrate 120, the interlayer insulating layer 134 of the FEOL structure 130, and the inter-metal insulating layer 148 of the BEOL structure 140. The conductive barrier layer 34 of the TSV structure 30 includes a first outer wall portion that is surrounded by the substrate 120, a second outer wall portion that is surrounded by the interlayer insulating layer 134, and a third outer wall portion that is surrounded by the inter-metal insulating layer 148.

An upper wire 158 extends between the TSV structure 30 and the upper connection terminal 154 on the BEOL structure 140 in order to electrically connect the TSV structure 30 to the upper connection terminal 154.

The bottom surface 30B of the TSV structure 30 is covered by the second conductive layer 64. The connection terminal 70 may be electrically connected to the TSV structure 30 via the second conductive layer 64. The lower surface 70T and the side wall 70S of the connection terminal 70 are at least partially covered by the metal capping layer 80.

The upper connection terminal 154 and the connection terminal 70 are not limited to the examples shown in FIG. 3, and may be formed as any of a conductive pad, a solder ball, a solder bump, or a redistribution conductive layer. In some embodiments, the upper connection terminal 154 may be omitted.

Figure 4:
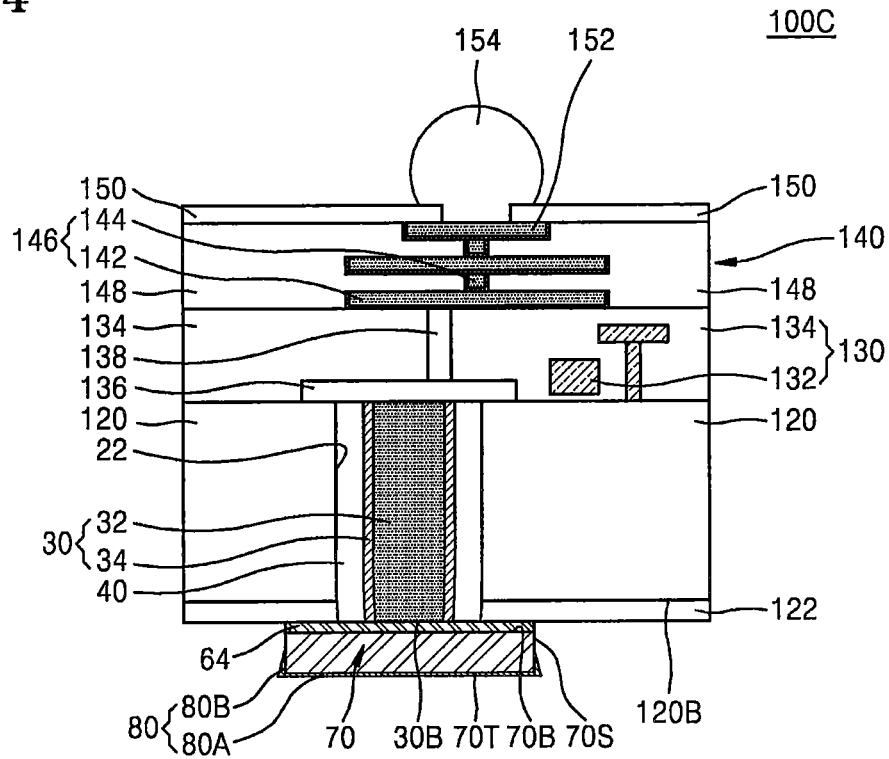
FIG. 4 is a cross-sectional view of an integrated circuit device according to still another exemplary embodiment of the inventive concepts.

FIG. 4 is a cross-sectional view of an integrated circuit device 100C according to another exemplary embodiment of the inventive concepts. In FIG. 4, like reference numerals as those of FIGS. 1-3 denote the same elements, and descriptions thereof will be omitted.

In the integrated circuit device 100C, the TSV structure 30 extends through the substrate 120. After forming the TSV structure 30, the FEOL structure 130 and the BEOL structure 140 are formed on the TSV structure 30 and the substrate 120. The TSV structure 30 may be connected to the multi-layered wiring structure 146 of the BEOL structure 140 via connection wires 136 and 138 that are included in the FEOL structure 130.

The bottom surface 30B of the TSV structure 30 is covered by the second conductive layer 64. The connection terminal 70 may be electrically connected to the TSV structure 30 via the second conductive layer 64. The lower surface 70T and the side walls 70S of the connection terminal 70 are at least partially covered by the metal capping layer 80.

The upper connection terminal 154 and the connection terminal 7Q are not limited to the examples shown in FIG. 4, and may be, for example, formed as any of a conductive pad, a solder ball, a solder bump, or a redistribution conductive layer. In some embodiments, the upper connection terminal 154 may be omitted.

Figure 5:
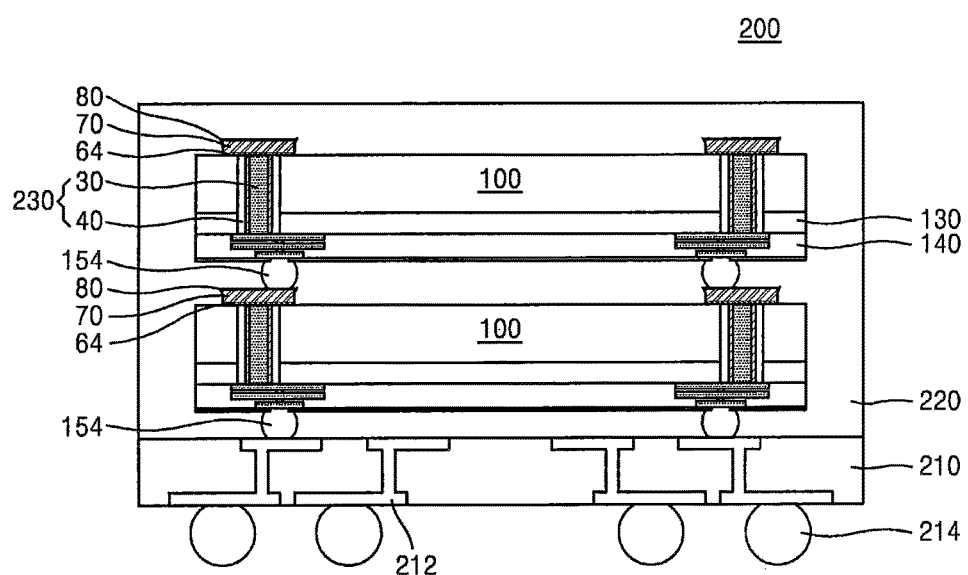
FIG. 5 is a schematic cross-sectional view of a semiconductor package according to an exemplary embodiment of the inventive concepts.

FIG. 5 is a cross-sectional view of a semiconductor package 200 according to an exemplary embodiment of the inventive concepts. In FIG. 5, like reference numerals as those of FIGS. 1-4 denote the same elements, and descriptions thereof will be omitted.

Referring to FIG. 5, the semiconductor package 200 may include a package substrate 210, and at least one integrated circuit device 100 mounted on the package substrate 210.

In some embodiments, the package substrate 210 may be a printed circuit board, in which wiring structures 212 are formed.

In FIG. 5, two integrated circuit devices 100 are mounted on the semiconductor package 200. However, the inventive concepts are not limited thereto. That is, a plurality of integrated circuit devices 100 may be mounted on the package substrate 210 in a vertical or a horizontal direction. In FIG. 5, some elements of the integrated circuit device 100 are omitted for convenience of description; however, the at least one integrated circuit device 100 may have the structure of at least one selected from the group consisting of the integrated circuit devices 10, 100A, 100B, and 100C exemplarily shown in FIGS. 1-4. In each integrated circuit device 100, the TSV structure 30 and the via insulating layer 40 surrounding the TSV structure 30 may form a TSV unit 230.

A plurality of connection terminals 214 for electrically connecting to external elements are formed on the package substrate 210 and connected to the internal wiring structures 212. The connection terminals 214 may be solder balls, but the inventive concepts are not limited thereto.

The electrical connection between the package substrate 210 and the integrated circuit device 100 or the electrical connection between two adjacent integrated circuit devices 100 may be formed using the TSV structures 30, the upper connection terminals 154, the second conductive layers 64, the connection terminals 70, and the metal capping layers 80 that are formed in the integrated circuit device 100.

As exemplarily shown in FIG. 5, two integrated circuit devices 100 may be mounted in a vertical direction on the package substrate 210 so that they may be electrically connected together in the semiconductor package 200. The metal capping layer 80 covering the lower surface 70T and the side walls 70S of the connection terminal 70 of the lower integrated circuit device 100 functions as a wetting layer so that the connection terminal 70 formed on the lower integrated circuit device 100 and the upper connection terminal 154 formed on the upper integrated circuit device 100 may be bonded together. While the connection terminal 70 formed on the lower integrated circuit device 100 and the upper connection terminal 154 formed on the upper integrated circuit device 100 are bonded together, the metal capping layer 80 between the connection terminal 70 and the upper connection terminal 154 is intermixed with the peripheral parts of the connection terminal 70 and the upper connection terminal 154 due to direct and indirect influences of heat applied in a reflow process, and then, an intermetallic compound (IMC) containing the component of the metal capping layer 80, for example, Au, may be formed at bonding portion between the connection terminal 70 and the upper connection terminal 154.

The semiconductor package 200 may include a molding layer 220 for molding the at least one integrated circuit device 100. The molding layer 220 may comprise a polymer such as, for example, an epoxy molding compound (EMC).

Figure 6:
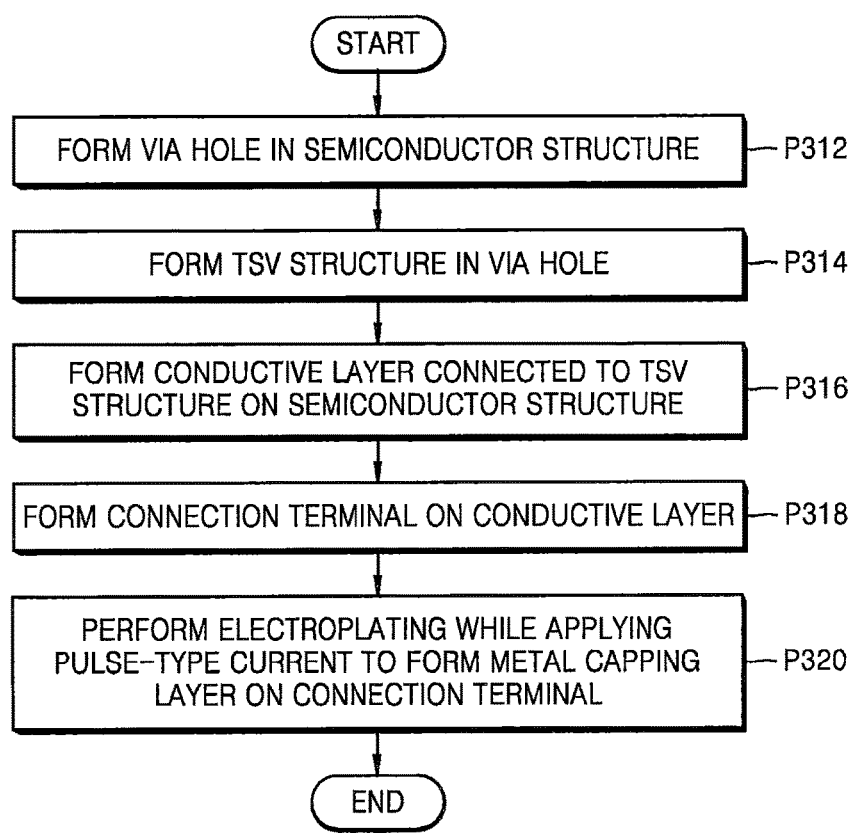
FIG. 6 is a flowchart of a method of manufacturing an integrated circuit device according to an exemplary embodiment of the inventive concepts.

FIG. 6 is a flowchart of a method of manufacturing an integrated circuit device, according to an exemplary embodiment of the inventive concepts. Hereinafter, descriptions of the elements that were described above with reference to FIGS. 1-5 will be omitted.

Referring to FIGS. 1-6, in operation P312, the via hole 22 is formed through the semiconductor structure 20.

The semiconductor structure 20 may include the substrate 120 shown in FIGS. 2-4.

In operation P314, the via insulating layer 40 is formed covering an inner wall of the via hole 22, and the TSV structure 30 is formed on the via insulating layer 40 and surrounded by the via insulating layer 40. The TSV structure 30 and the via insulating layer 40 may form the TSV unit 230 (see FIG. 5).

The via insulating layer 40 may be formed by a low pressure CVD process or a plasma-enhanced CVD (PECVD) process.

The TSV structure 30 may be formed by a physical vapour deposition (PVD) process, a CVD process, a plating process, or a combination thereof.

In operation P316, a conductive layer is formed on the semiconductor structure 20 that is physically and electrically connected to the TSV structure 30.

The conductive layer may correspond to the second conductive layer 64 shown in FIGS. 1-5.

In operation P318, the connection terminal 70 is formed on the conductive layer that is formed in operation P316.

The connection terminal 70 may be formed by an electroplating process or an electroless plating process.

In some embodiments, the connection terminal 70 may be formed of Ni using the electroplating process, a direct current (CD) plating process, a pulse plating process, or a reverse pulse plating process may be used. When the connection terminal 70 is formed using a pulse plating process, a coverage property may be superior to that of a DC plating process. When the Ni connection terminal 70 is formed using an electroplating process, an electro Ni plating solution may include an anode solvent, a pH buffering agent, or an additive for improving electrode-deposit stress or a surface state of the connection terminal 70. The additive may be saccharine, naphthalene sodium (di-, tri-) sulfonate, sulfonamide, sulfinic acid, 1,4-butynediol, or coumarin. As an anode solvent, electrolytic nickel, depolarized nickel, carbonized nickel, or sulfur-containing nickel may be used.

In order to form a Ni connection terminal 70 using an electroless plating process, an electroless Ni plating solution may be used. The electroless Ni plating solution may be a solution including a metal salt mainly containing Ni, a reducing agent, a buffering agent, and a complexing agent. A concentration of Ni in the electroless Ni plating solution may be about 1 g/L to about 1.5 g/L.

As the metal salt mainly containing Ni, nickel sulphate, nickel chloride, nickel carbonate, or nickel ammonium sulphate may be used. Phosphinate ($NaH_2PO_2.H_2O$) or dimethylamine borane (DMAB) may be used as the reducing agent. As the buffering agent, monocarboxylic acid such as formic acid and acetic acid, or alkali metallic salt thereof may be used. In addition, as the complexing agent, organic acid, ethylenediamine tetraacetic acid (EDTA), or ammonia may be used.

The Ni plating solution may be an acidic plating solution having a pH of about 4 to 6, or an alkali plating solution having a pH of about 6 to about 10. The electroless Ni plating solution may be maintained at a temperature of about 60° C. to about 80° C.

After forming the connection terminal 70 in operation P318 shown in FIG. 6, a resultant structure, on which the connection terminal 70 is formed, may be rinsed by a rinse solution. The rinse solution may be deionized water, but is not limited thereto.

In operation P320, an electroplating process is performed while applying a pulse-type current using the conductive layer formed in operation P316 as an electrode so that the metal capping layer 80 is formed on the connection terminal 70.

The metal capping layer 80 may be formed in-situ with the forming of the connection terminal 70 after forming the connection terminal 70 in operation P318. In the present specification, forming the metal capping layer 80 in-situ with the forming of the connection terminal 70 may denote that the electroplating process for forming the metal capping layer 80 on the connection terminal 70 is performed in a state where the rinse solution used to rinse the resultant, on which the connection terminal 70 is formed, does not dry out on a surface of the connection terminal 70, that is, in a state where the rinse solution remains on the connection terminal 70.

The metal capping layer 80 may be formed to include the flat capping portion 80A that covers the lower surface 70T of the connection terminal 70, and the wedge-shaped capping portions 80B that are integrally connected to the flat capping portion 80A and that partially cover the side walls 70S of the connection terminal 70.

A metal strike electroplating process may be performed to form the metal capping layer 80. If the metal capping layer 80 is formed of Au, Au strike electroplating solution may be used to perform the Au strike plating process. The Au strike electroplating solution may be a cyanide or non-cyanide Au plating solution.

In one or more exemplary embodiments, the Au strike plating solution may contain Au ions at a concentration of about 2 g/L or less.

In some embodiments, the metal strike electroplating solution may include electrolytes including $SO_3$-group. In addition, the electrolyte may be contained in the electroplating solution at a concentration of about 10 g/L to about 20 g/L. The metal strike electroplating solution may have a PH of about 8 to about 13. In other embodiments, the metal strike electroplating solution may be neutral.

In some embodiments, the electrolyte may be sulfuric acid, alkyl sulfonic acids, for example, methane sulfonic acid, ethane sulfonic acid, propane sulfonic acid, and trifluoromethane sulfonic acid, aryl sulfonic acid, for example, phenyl sulfonic acid and toluene sulfonic acid, or sulfamic acid, but is not limited thereto.

The metal strike electroplating process used to form the metal capping layer 80 may be performed at a temperature range of about 10° C. to about 65° C.

In some embodiments, a cyanide bath may be used to perform the metal strike electroplating process. The cyanide bath may include gold salt, potassium gold(I) cyanide, potassium cyanide used as free-cyanide-ion source, potassium carbonate for improving electrodeposition, and dipotassium hydrogen phosphate functioning as a pH buffering agent.

When performing the metal strike electroplating process as described above, the flat capping portion 80A may be formed to a thickness of about 0.05 µm to about 0.5 µm from the lower surface 70T of the connection terminal 70 with a thickness variation of about ±3% throughout the region that contacts the lower surface 70T of the connection terminal 70, and the wedge-shaped capping portions 80B that are integrally connected to the flat capping portion 80A and that partially cover the side walls 70S of the connection terminal 70 may be formed.

When a Au metal capping layer 80 is formed, a plating bath having a relatively low metal concentration, for example, a plating bath including the metal strike electroplating solution including Au ions of about 2 g/L or less, may be used, and a current having a relatively high current density, for example, a current density of about 0.05 A/dm$^2$ to about 3 A/dm$^2$, is applied within a short period of time as a pulse type. Then, the thickness of the Au metal capping layer 80 may be easily adjusted, and adhesion of the Au metal capping layer 80 to the connection terminal 70 may be improved.

Figure 7:
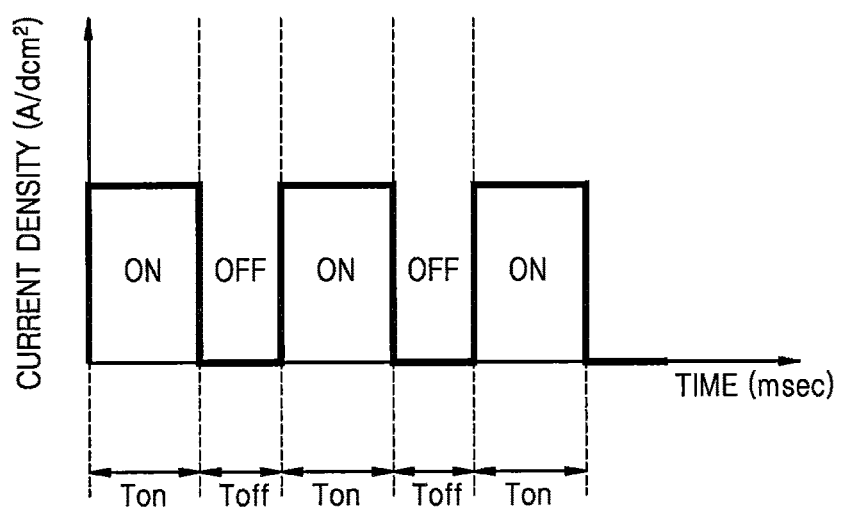
FIG. 7 is a graph illustrating a pulse plating process for forming a metal capping layer in a method of manufacturing an integrated circuit device according to an exemplary embodiment of the inventive concepts.

FIG. 7 is a graph of an exemplary pulse plating process that may be used to form the metal capping layer 80 in operation P320 of FIG. 6.

Referring to FIG. 7, the metal capping layer 80 may be formed by applying a current through the electroplating solution (e.g., a Au strike plating solution described above) for an On-time period Ton and then turning the current off for an OFF-time period Toff for at least two cycles.

The current may have a current density of, for example, about 0.05 A/dm$^2$ to about 3 A/dm$^2$, and the current may be applied through the Au strike plating solution during the ON-time period Ton.

In addition, a duty cycle of the ON-time period Ton and the OFF-time period Toff {Ton/(Ton+Toff)} may be set as, for example, about 5% to about 95%.

Figure 8:
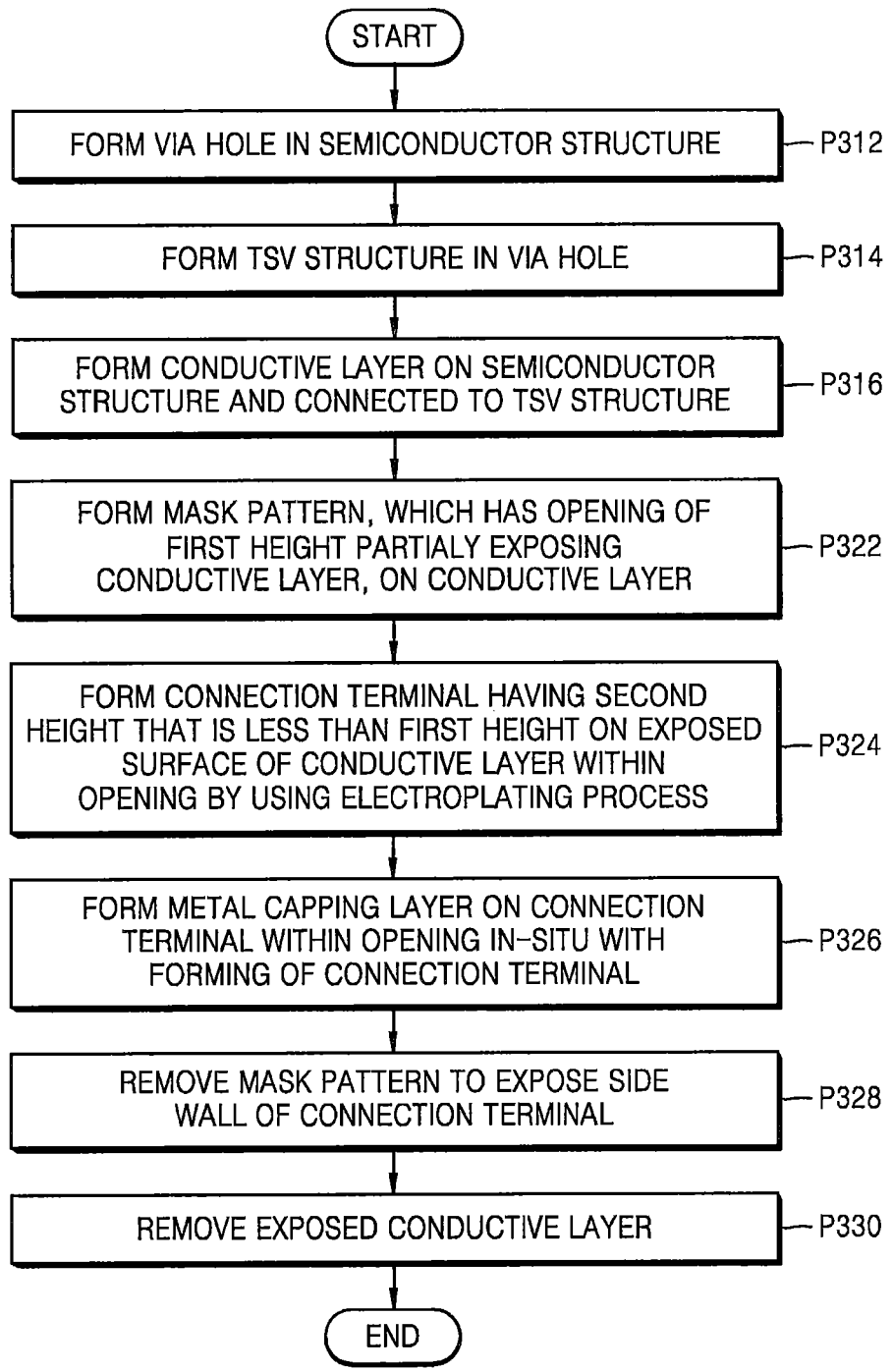
FIG. 8 is a flowchart of a method of manufacturing an integrated circuit device according to an exemplary embodiment of the inventive concepts.

FIG. 8 is a flowchart illustrating a method of manufacturing an integrated circuit device according to another embodiment of the inventive concepts.

FIGS. 9A to 9E are cross-sectional views illustrating the method of manufacturing the integrated circuit device of FIG. 8 in the processing order illustrated in FIG. 8. Hereinafter, descriptions of elements that are described above with reference to FIGS. 1 to 6 will be omitted for the sake of brevity.

Figure 9A:
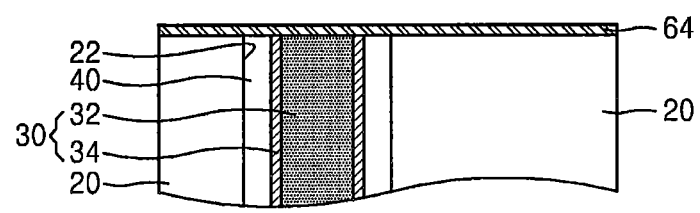
FIGS. 9A through 9E are cross-sectional views illustrating processing steps of a method of manufacturing an integrated circuit device according to an exemplary embodiment of the inventive concepts.

Referring to FIGS. 8 and 9A, operation P312, operation P314, and operation P316 are described above with reference to FIG. 6 and may be performed sequentially to form the conductive layer that is connected to the TSV structure 30 on the semiconductor structure 20. As shown in FIG. 9A, the conductive layer may, for example, be the second conductive layer 64 that is illustrated in FIG. 1.

Figure 9B:
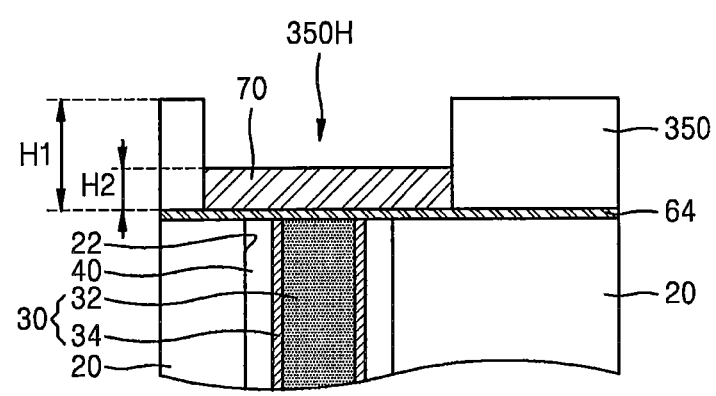

Referring to FIGS. 8 and 9B, in operation P322, a mask pattern 350 that has an opening 350H is formed on the second conductive layer 64. The mask pattern 350 may have a thickness of H1 which will be referred to herein as a "first height H1." The hole 350H may extend all the way through the mask pattern 350 and hence the height of the hole may also be the first height H1. The hole 350H exposes a portion of the second conductive layer 64.

The mask pattern 350 may be a photoresist pattern.

Then, in operation P324 of FIG. 8, the connection terminal 70 is formed on the exposed surface of the second conductive layer 64 within the opening 350H. The connection terminal 70 has a second height H2 that is less than the first height H1. The connection terminal 70 may be formed via an electroplating process. An exemplary process for forming the connection terminal 70 is discussed above with reference to operation 318 of FIG. 6 and hence further description thereof will be omitted here.

After the connection terminal 70 is formed, the connection terminal 70 may be washed using a rinse solution. The rinse solution may be deionized water, but is not limited thereto.

Figure 9C:
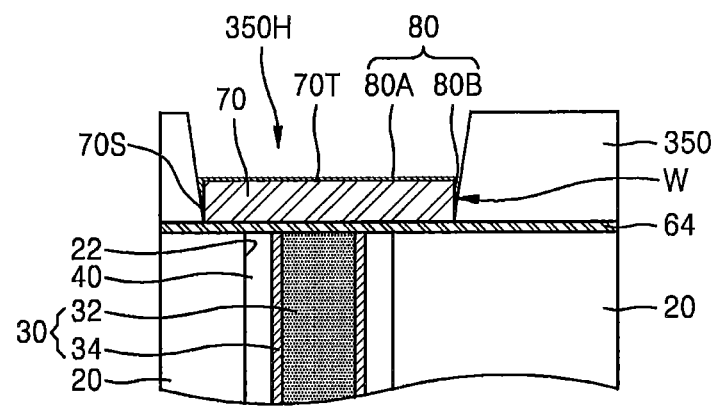

Referring to FIGS. 8 and 9C, in operation P326 of FIG. 8, the metal capping layer 80 is formed on the connection terminal 70 in the opening 350H. The metal-capping layer 80 may be formed in-situ following the formation of the connection terminal 70.

In order to form the metal capping layer 80 in-situ after the connection terminal 70 is formed, the connection terminal 70 may contact a metal strike electroplating solution in a state where the rinse solution does not dry out on the surface of the connection terminal 70 that is cleaned, that is, the rinse solution remains on the connection terminal 70, to form the metal capping layer 80 in operation 5326 of FIG. 8.

In order to form the metal capping layer 80, a pulse-type current may be applied using the second conductive layer 64 as an electrode to make the connection terminal 70 contact the metal strike electroplating solution, similar to the above description with reference to operation P320 of FIG. 6 and FIG. 7.

In some embodiments, while the metal capping layer 80 is formed, the mask pattern 350, which may be formed of a photoresist material, may undergo a swell phenomenon in the Au strike electroplating solution. Thus, as shown in FIG. 9C, wedge-shaped spaces W may be formed between each side wall 70S of the connection terminal 70 and the corresponding side wall of the mask pattern 350.

Accordingly, while the metal capping layer 80 is formed, the flat capping portion 80A is formed to cover the lower surface 70T of the connection terminal 70, and at the same time, metal seeds having fine sizes, for example, Au seeds, are formed on portions of each side wall 70S of the connection terminal 70 within the wedge-shaped spaces W and hence the wedge-shaped capping portions 80B of the metal capping layer 80 are grown in the wedge-shaped spaces W.

When the metal capping layer 80 is formed via a pulse plating process, the metal seeds grow slowly, unlike in a DC plating process, and the metal seeds may be formed uniformly. Accordingly, the metal seeds may be uniformly grown in the wedge-shaped spaces W between the mask pattern 350 and the connection terminal 70 because the side walls of the mask pattern 350 corresponding to the connection terminal 70 are isolated during the pulse plating process, and then, the wedge-shaped capping portions 80B may be formed from the metal seeds within the wedge-shaped spaces W. However, if a DC plating process is performed, the growth speed of the metal seeds may be much faster, and then, an inlet into the wedge-shaped spaces that are formed between the mask pattern 350 and the connection terminal 70 may be blocked by the fast-growing metal seeds. Accordingly, if the DC plating process is used, the wedge-shaped plating layer may not form between the mask pattern 350 and the connection terminal 70. Therefore, when a DC plating process is performed, a plating layer having a flat shape may be obtained.

Thus, pursuant to embodiments of the inventive concepts, a pulse plating method may be used to form the metal capping layer 80, and thus, the metal capping layer 80 may include both the flat capping portion 80A that covers the lower surface 70T of the connection terminal 70 and the wedge-shaped capping portions 80B that are integral to the flat capping portion 80A and formed within the wedge-shaped spaces W between the side walls 70S of the connection terminal 70 and the respective side walls of the mask pattern 350 within the opening 350H.

As described above, in operation P326 of FIG. 8, the electroplating process may be performed to form the metal capping layer 80 by applying a pulse-type current, similarly to operation P320 of FIG. 6.

Figure 10A:
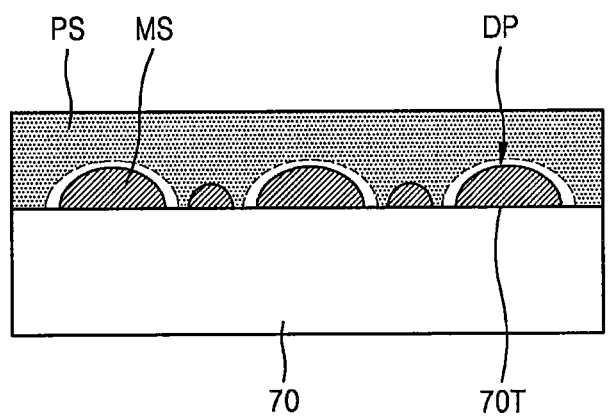
FIGS. 10A through 10C are diagrams illustrating a process of forming a metal capping layer using a pulse-type current electro-plating method according to an exemplary embodiment of the inventive concepts.
Figure 10B:
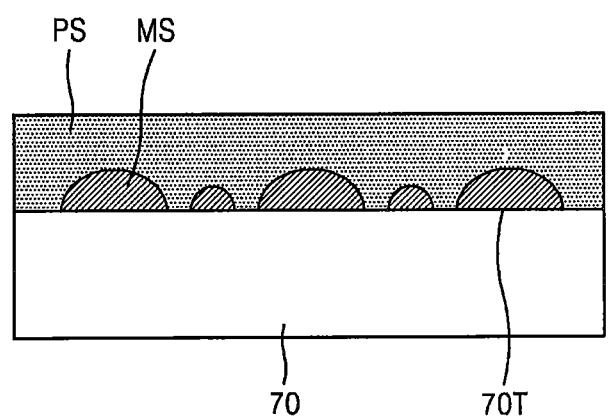
Figure 10C:
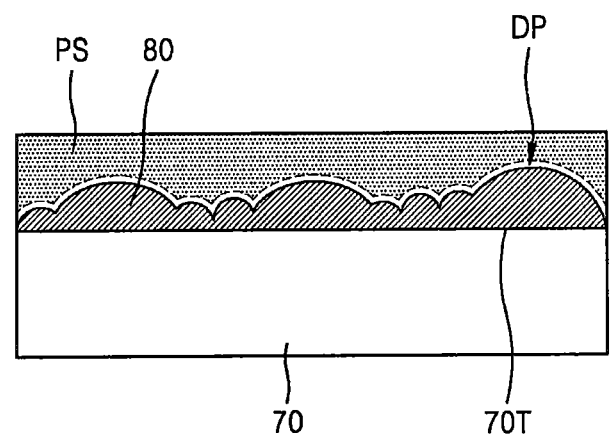

FIGS. 10A to 10C are diagrams further illustrating the process of forming the metal capping layer 80 via an electroplating process in which a pulse-type current is applied. In each of FIGS. 10A to 10C only a portion of the lower surface 70T of the connection terminal 70 is shown.

Referring to FIG. 10A, during an initial stage of the electroplating process for forming the metal capping layer 80, for example, from the start of the electroplating process until about 50 msec into the electroplating process, current having a current density of about 0.05 A/dm$^2$ to about 3 A/dm$^2$ is applied during the ON-time period Ton. As shown in FIG. 10A, metal seeds MS, for example, Au seeds, are formed on the lower surface 70T of the connection terminal 70 in the metal strike plating solution PS, which may be, for example, a Au strike plating solution. In addition, a depletion area DP of metal ions, for example, Au ions, may be formed around the metal seeds MS, or around interfaces between the metal seeds MS and the metal strike plating solution PS.

Referring to FIG. 10B, during the OFF-time period Toff that follows the initial ON-time period Ton in which the current is not applied, the metal ions (e.g., Au ions) may be supplemented in the depletion area DP around the metal seeds MS or around the interfaces between the metal seeds MS and the metal strike plating solution PS. Accordingly, a corrosion effect in which metal seeds having relatively smaller sizes are extinguished, which may otherwise occur, may be reduced or prevented. Thus, the metal seeds may be stably maintained during the OFF-time period Toff, and the metal seeds may be continuously grown. The initial OFF-time period Toff may last from, for example, about 50 to about 500 msec after the start of the electroplating process.

Referring to FIG. 10C, when the ON-time period Ton is repeated after the initial OFF-time period Toff that is described above with reference to FIG. 10B, current having a current density of about 0.05 to 3 A/dm$^2$ may be applied, and new metal seeds (e.g., Au seeds) may be formed on the connection terminal 70. Accordingly, the depletion area DP may be formed again around the metal seeds MS or around the interfaces between the metal seeds MS and the metal strike plating solution PS.

The pulse electroplating process having an ON-time period Ton and an OFF-time period Toff that is described above with reference to FIGS. 10A to 10C may be performed a few times to tens of times repeatedly and alternately, that is, the plating process may be performed by applying the current for a predetermined time and then suspending the application of the current for a predetermined time. As such, metal ions (e.g., Au ions) may be sufficiently supplied as compared to a DC electroplating process in which the current is continuously applied during the plating process. Accordingly, the uniformity of the thickness of the metal capping layer 80 may be improved while maintaining the adhesion thereof with respect to the connection terminal 70. Therefore, the metal capping layer 80 may have a flat capping portion 80A that has a thickness variation within ±3% throughout the entire area thereof that contacts the lower surface 70T of the connection terminal 70.

In some embodiments, the flat capping portion 80A may be formed to a thickness of about 0.05 μm to about 0.5 μm from the lower surface 70T of the connection terminal 70.

The wedge-shaped capping portions 80B of the metal capping layer 80 may extend to cover each side wall 70S of the connection terminal 70 and may each extend a distance that is less than or equal to one half the length of the respective side walls 70S. In some embodiments, the side walls 70S may be substantially vertical side walls so that the length of each side wall is equal to the thickness of the connection terminal 70. When the thickness of the connection terminal 70, that is, a vertical length of the side wall 70S, is about 6 μm, the wedge-shaped capping portion 80B may extend from the lower surface 70T of the connection terminal 70 to about 0.1 μm to 3 μm along the side wall 70S of the connection terminal 70, but is not limited thereto. The wedge-shaped capping portion 80B of the metal capping layer 80 may have a thickness that decreases with increasing distance from the lower surface 70T of the connection terminal 70. Typically, the thickness of the wedge-shaped capping portion 80B will decrease with increasing distance from the lower surface 70T of the connection terminal 70 in a continuous manner, but embodiments of the present invention are not limited thereto. For example, in other embodiments, the thickness of the wedge-shaped capping portion 80B may decrease with increasing distance from the lower surface 70T of the connection terminal 70 in a stepped manner or in a combination of a continuous manner and a stepped manner.

Figure 9D:
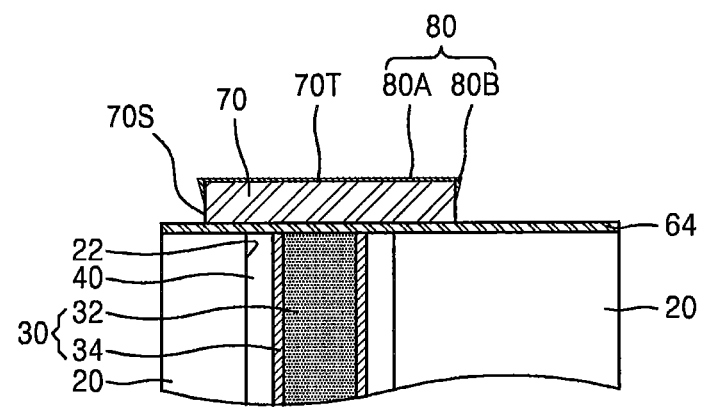

Referring to FIGS. 8 and 9D, in operation P328 of FIG. 8, the mask pattern 350 is removed to expose the side walls 70S of the connection terminal 70 and portions of the second conductive layer 64.

Figure 9E:
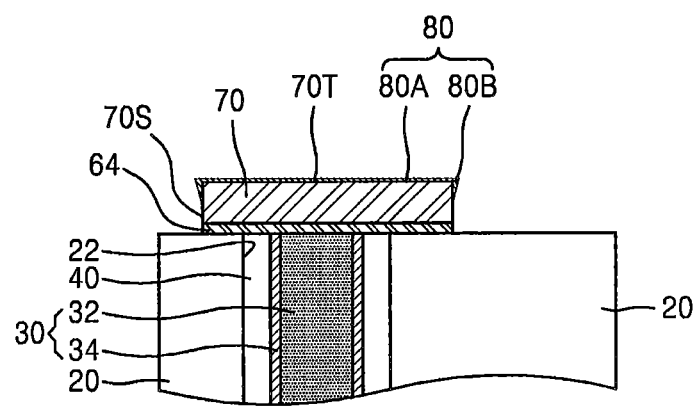

Referring to FIG. 9E, in operation P330 of FIG. 8, the exposed portions of the second conductive layer 64 may be removed to expose the semiconductor structure 20.

Hereinafter, methods of manufacturing an integrated circuit device according to exemplary embodiments of the inventive concepts will be described below with reference to FIGS. 11A to 11O.

Figure 11A:
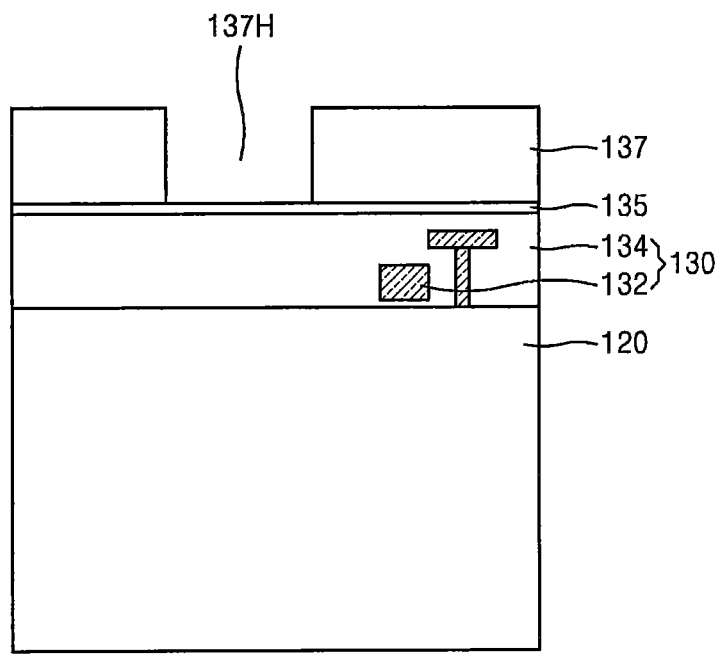
FIGS. 11A through 11O are cross-sectional views of a method of manufacturing an integrated circuit device according to an exemplary embodiment of the inventive concepts.
Figure 11B:
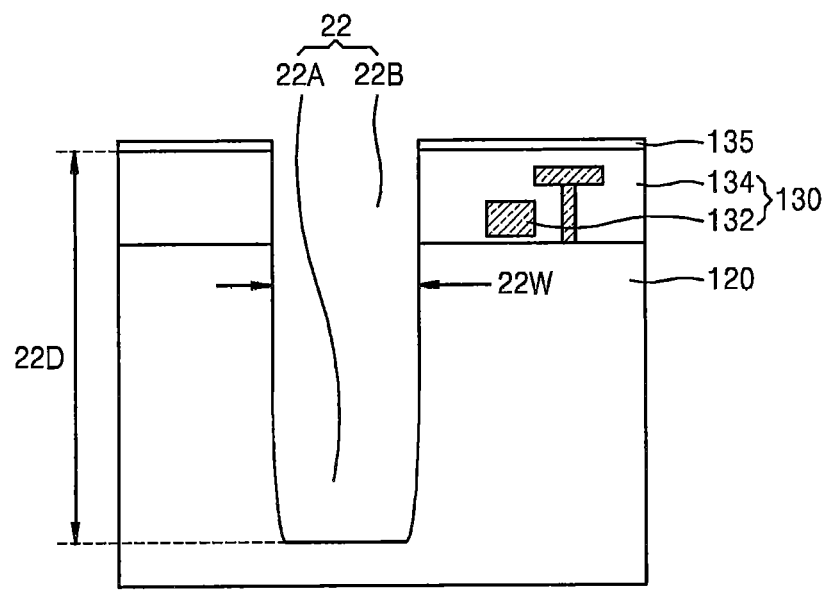
Figure 11C:
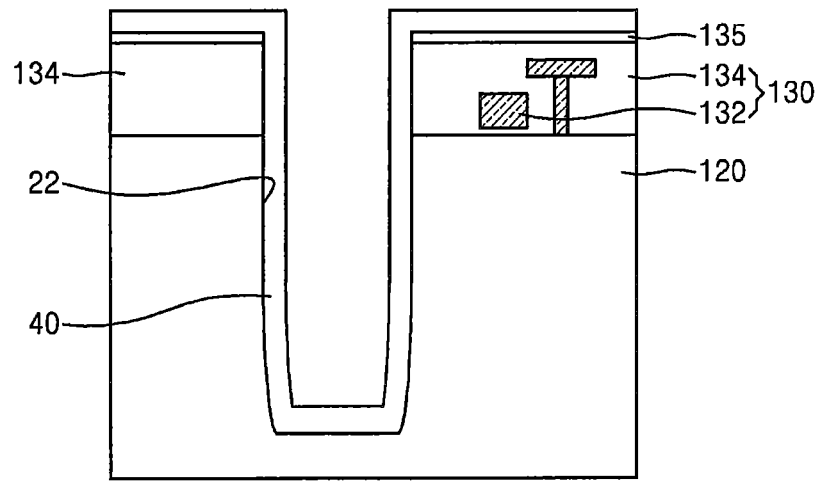
Figure 11D:
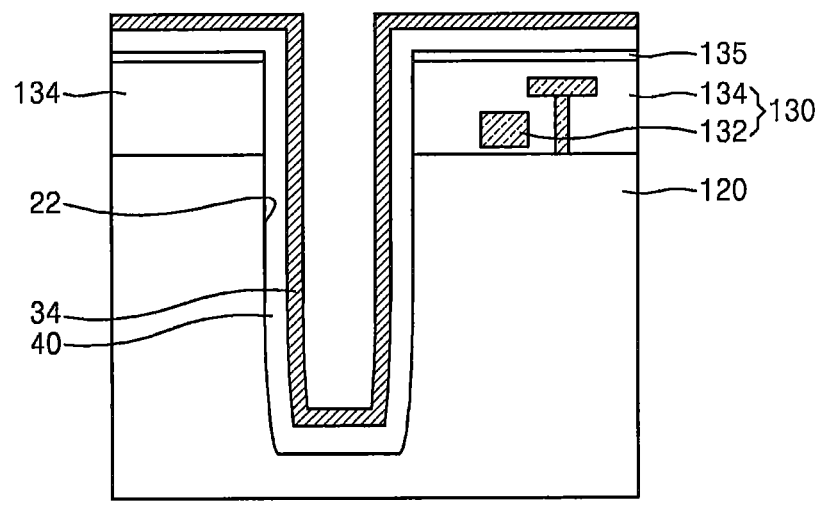
Figure 11E:
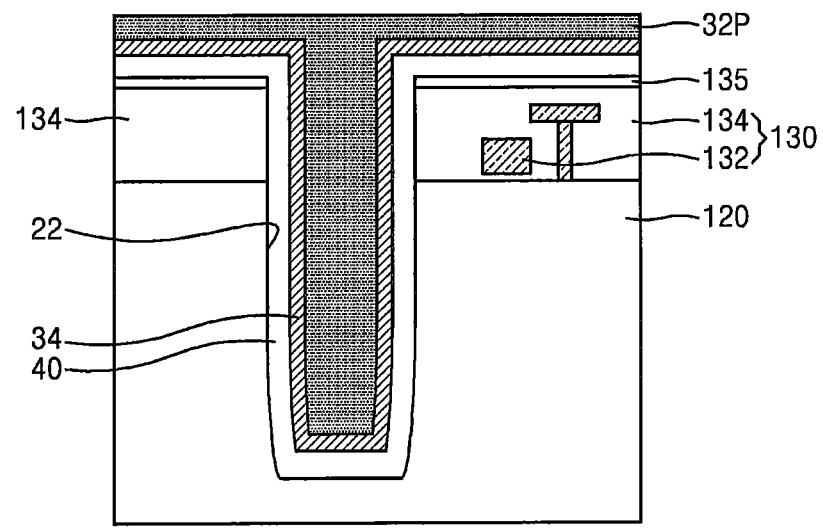
Figure 11F:
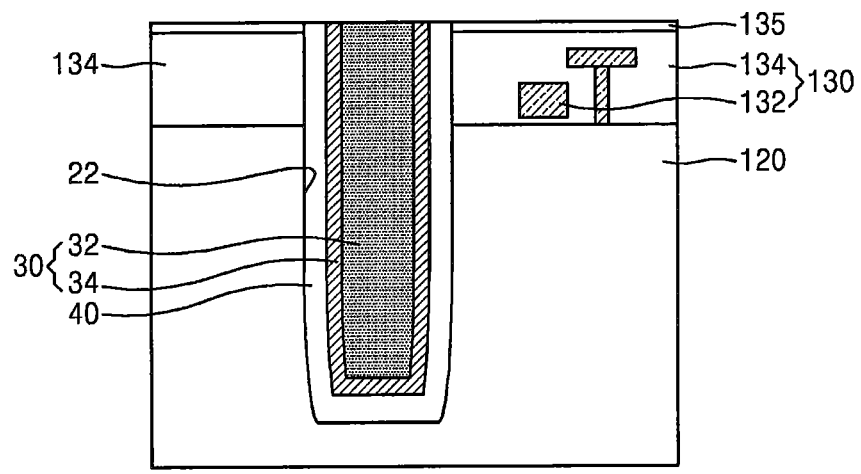
Figure 11G:
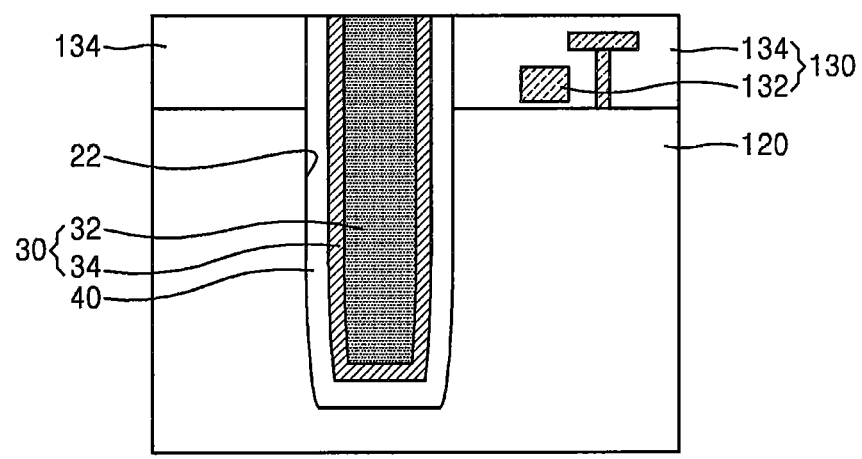
Figure 11H:
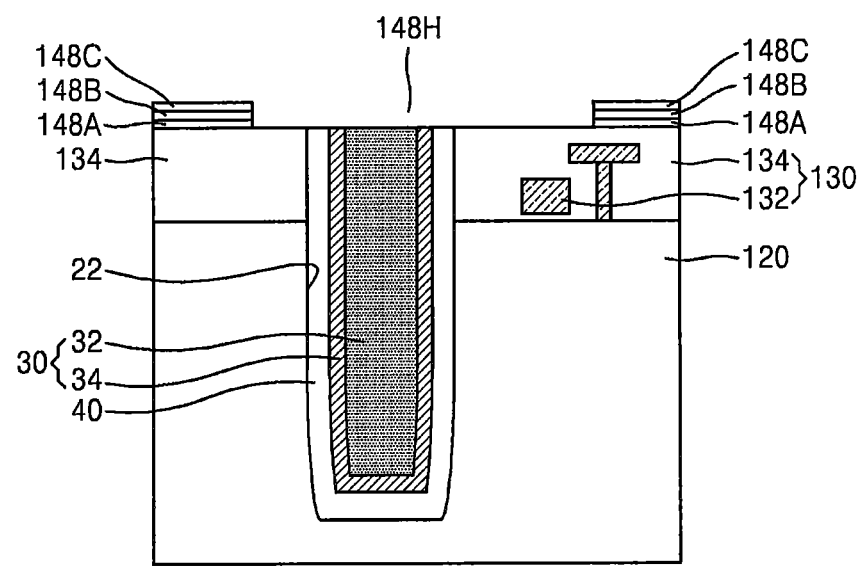
Figure 11I:
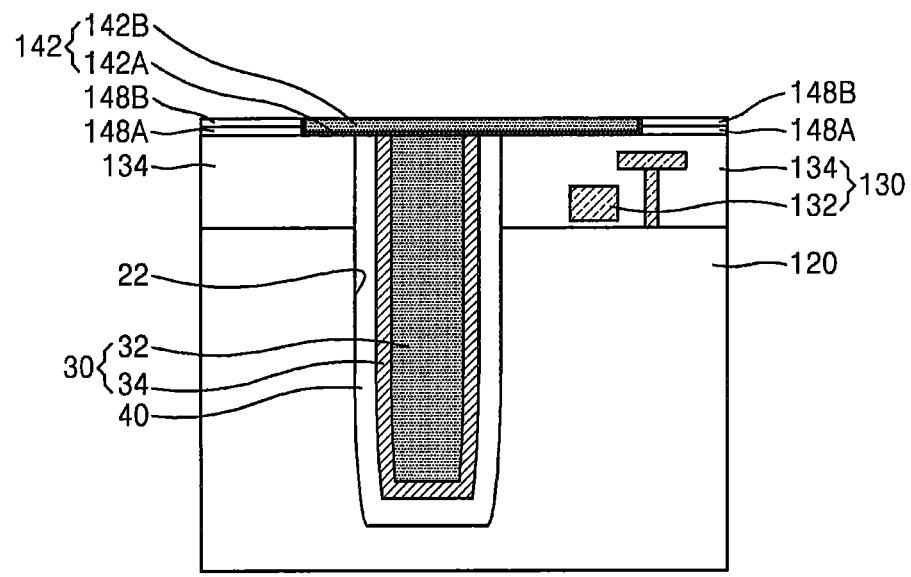
Figure 11J:
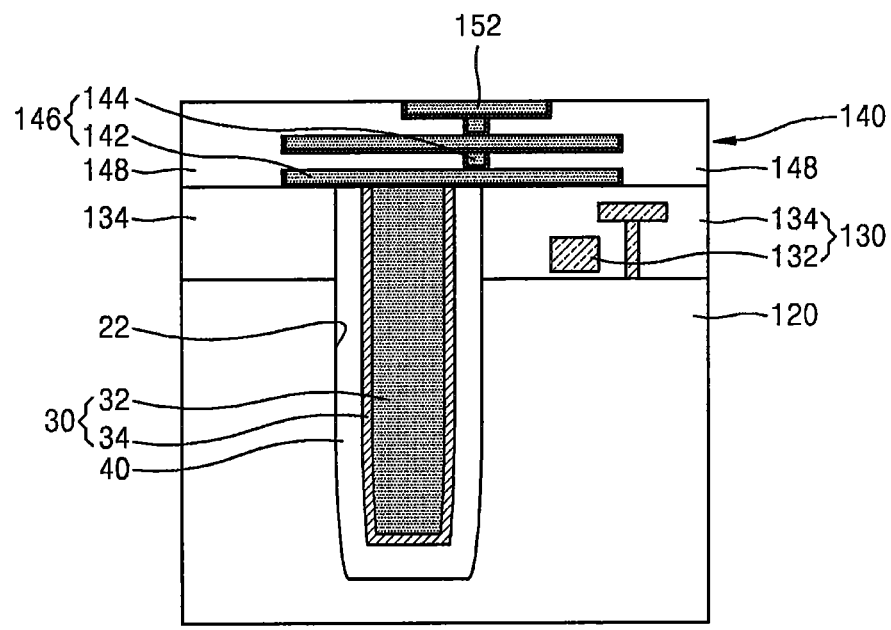
Figure 11K:
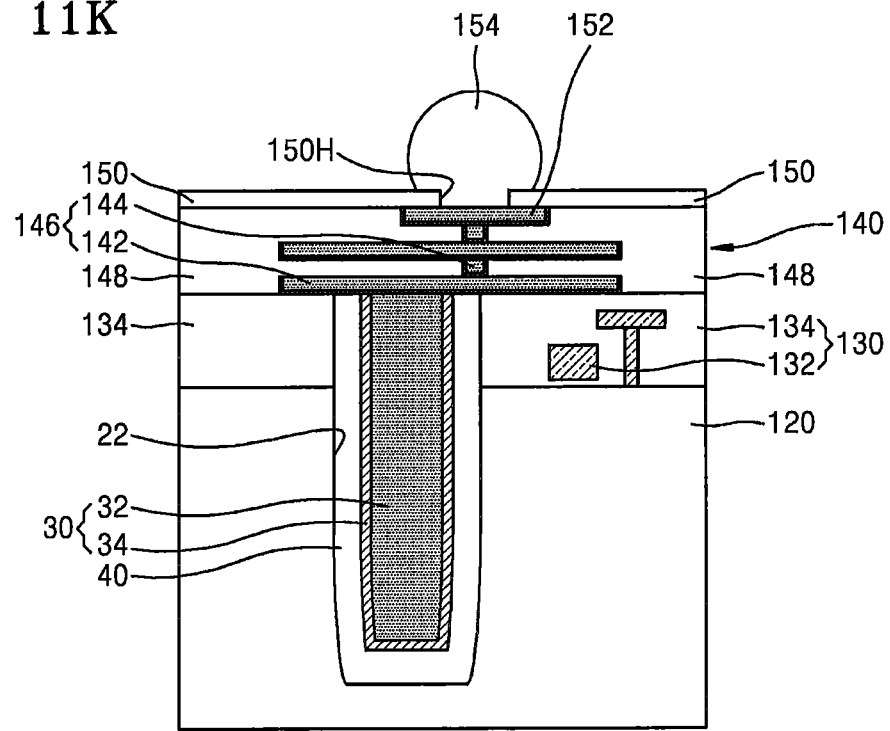
Figure 11L:
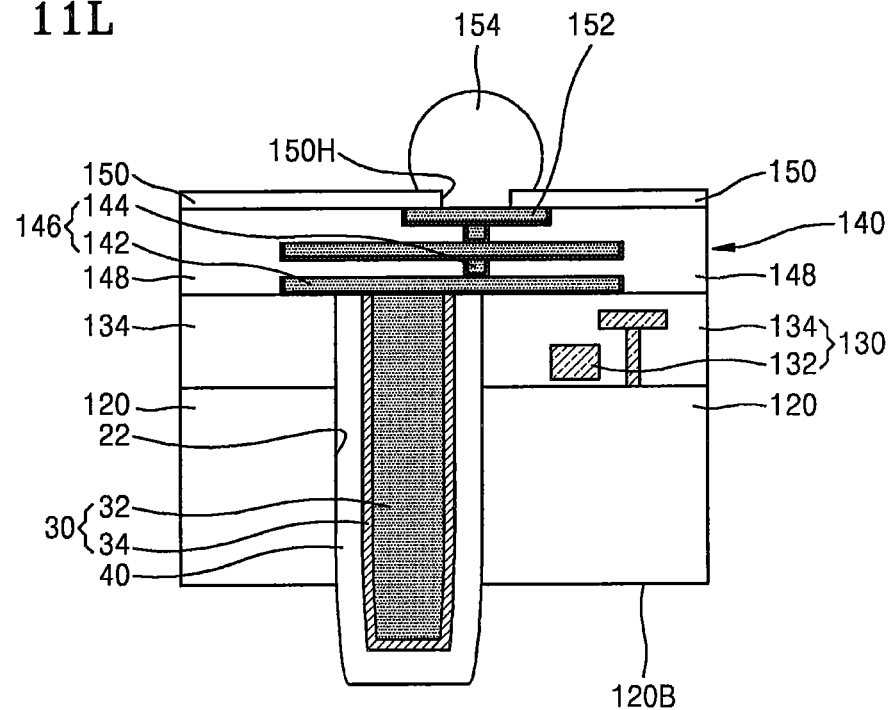
Figure 11M:
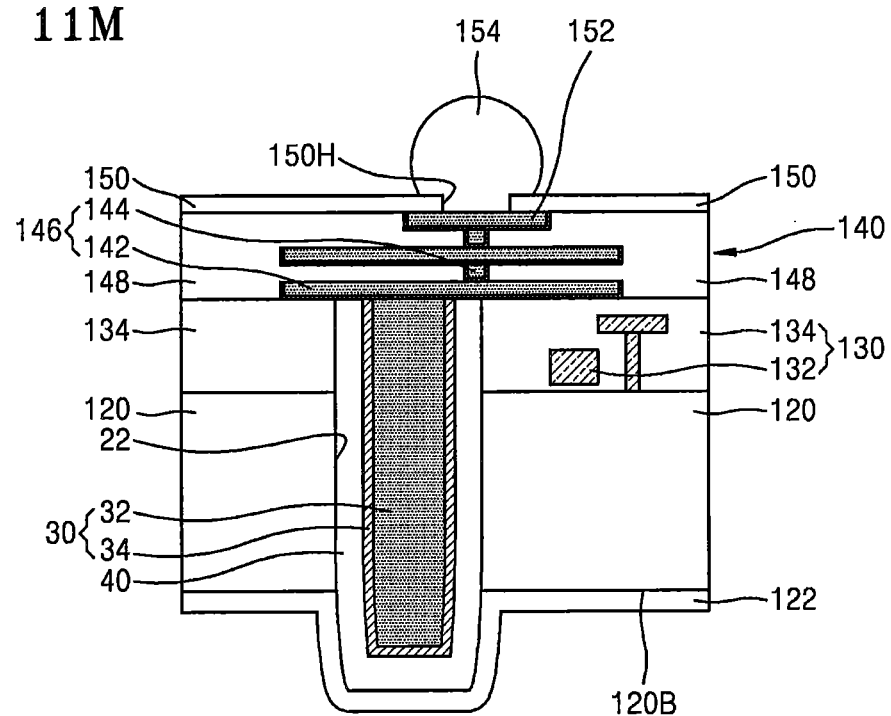
Figure 11N:
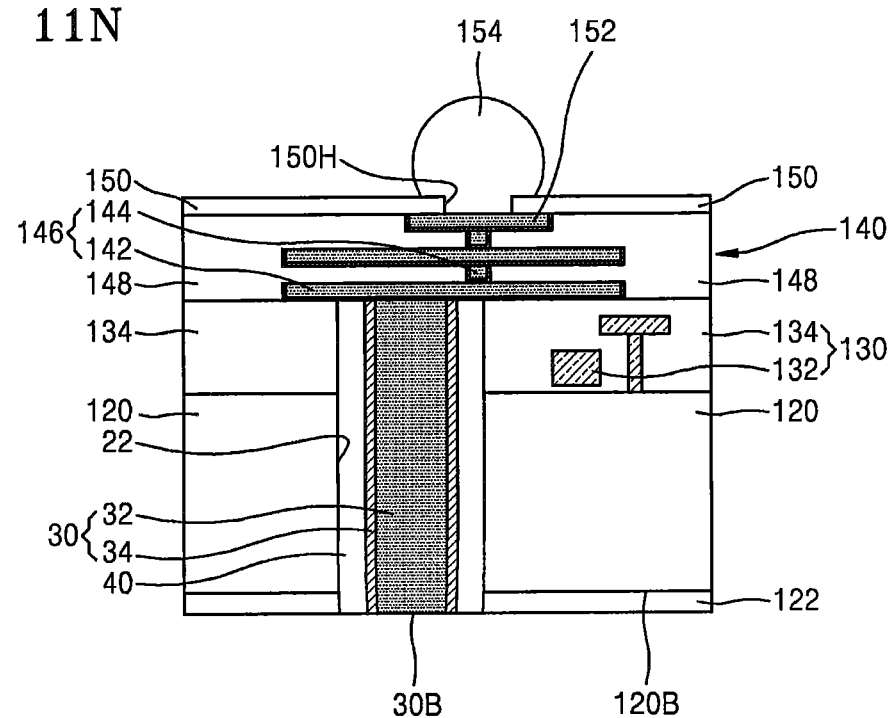
Figure 11O:
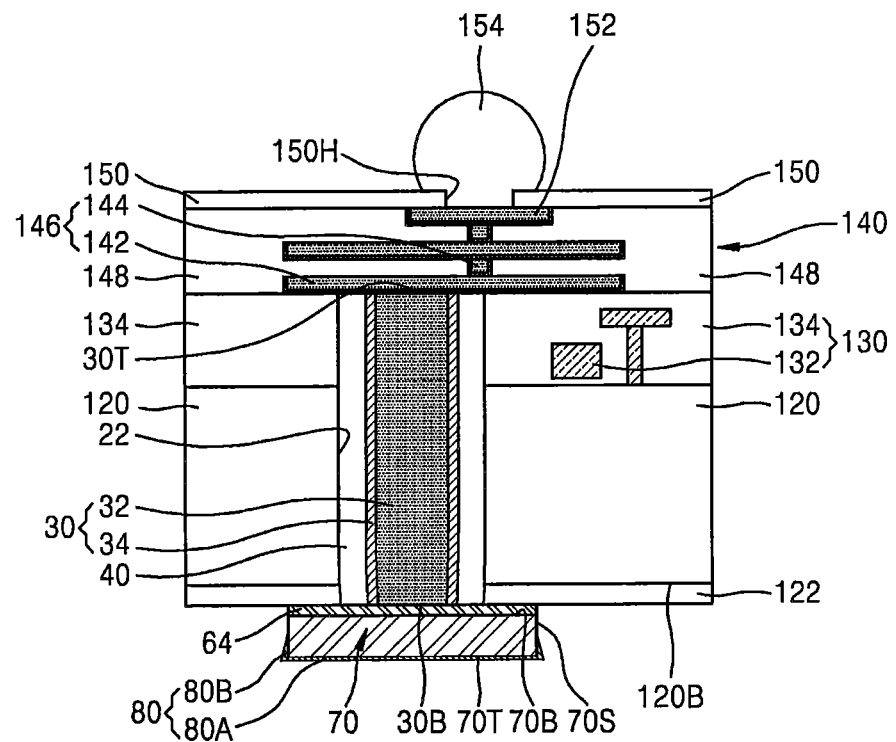

FIGS. 11A to 11O are cross-sectional views illustrating a method of manufacturing the integrated circuit device 100A (see FIG. 2) according to an exemplary embodiment of the inventive concepts. In FIGS. 11A to 11O, like reference numerals to those of FIGS. 1 and 2 denote the same elements, and descriptions thereof are omitted.

Referring to FIG. 11A, the FEOL structure 130 is formed on the substrate 120, a first polish stop layer 135 is formed on the FEOL structure 130, and the mask pattern 137 is formed on the first polish stop layer 135. The mask pattern 137 includes a hole 137H that partially exposes an upper surface of the first polish stop layer 135.

In some embodiments, the first polish stop layer 135 may be formed as a silicon nitride layer or a silicon oxynitride layer. The first polish stop layer 135 may be formed to a thickness of about 200 Å to about 1000 Å. The first polish stop layer 135 may be formed by a CVD process.

The mask pattern 137 may be formed as a photoresist layer.

Referring to FIG. 11B, the first polish stop layer 135 and the interlayer insulating layer 134 are etched using the mask pattern 137 (refer to FIG. 11A) as an etching mask, and the substrate 120 is etched to form the via hole 22. The via hole 22 includes a first hole 22A that penetrates the substrate 120 to a predetermined depth, and a second hole 22B penetrating through the interlayer insulating layer 134 to communicate with the first hole 22A.

The via hole 22 may be formed using an anisotropic etching process. In some embodiments, the via hole 22 may be formed in the substrate 120 to have a width 22W of about 10 μm or less. The via hole 22 may have a depth 22D of about 50 μm to about 100 μm from the upper surface of the interlayer insulating layer 134. However, the width 22W and the depth 22D of the via hole 22 are not limited to the above examples, and may have various numerical dimensions. The substrate 120 is exposed through the first hole 22A of the via hole 22, and the interlayer insulating layer 134 is exposed through the second hole 22B of the via hole 22. In another exemplary embodiment, the via hole 22 may be formed using a laser drilling process.

After forming the via hole 22, the mask pattern 137 is removed to expose the upper surface of the first polish stop layer 135.

Referring to FIG. 11C, a via insulating layer 40 is formed on an inner side wall and a bottom surface of the via hole 22, on the exposed side wall of the interlayer insulating layer 134, and on the upper surface of the first polish stop layer 135. The via insulating layer may thus cover the exposed inner side wall and bottom surface of the via hole 22.

Referring to FIG. 11D, the conductive barrier layer 34 is formed on the via insulating layer 40 both in and outside the via hole 22.

The conductive barrier layer 34 may be formed by a PVD process or a CVD process.

In some embodiments, the conductive barrier layer 34 may be a single material layer, while in other embodiments the conductive barrier layer 34 may be a multi-layer structure that includes at least two kinds of materials. The conductive barrier layer 34 may include at least one material selected from the group consisting of W, WN, WC, Ti, TiN, Ta, TaN, Ru, Co, Mn, WN, Ni, and NiB. For example, the conductive barrier layer 34 may have a structure in which a TaN layer having a thickness of about 50 to about 200 Å and a Ta layer having a thickness of about 1000 to about 3000 Å are stacked.

Referring to FIG. 11E, a metal layer 32P is formed on the conductive barrier layer 34 to substantially fill the remainder of the via hole 22.

The conductive barrier layer 34 and the metal layer 32P may both be formed under a vacuum atmosphere, although not necessarily under the same pressure conditions.

The metal layer 32P may cover the conductive barrier layer 34 both in and outside the via hole 22.

In some embodiments, the metal layer 32P may be formed via an electroplating process. In more detail, a metal seed layer (not shown) may be formed on the surface of the conductive barrier layer 34, and a metal layer may then be grown from the metal seed layer using the electroplating process to form the metal layer 32P on the conductive barrier layer 34 to fill the via hole 22. The metal seed layer may comprise Cu, a Cu alloy, Co, Ni, Ru, Co/Cu, or Ru/Cu. The metal seed layer may be formed by a PVD process. The metal layer 32P may mainly contain Cu or W. In some embodiments, the metal layer 32P may be Cu, CuSn, CuMg, CuNi, CuZn, CuPd, CuAu, CuRe, CuW, W, or W alloy, but is not limited thereto. The electroplating process may be performed at a temperature of about 10° C. to about 65° C. For example, the electroplating process may be performed at room temperature. After forming the metal layer 32P, the resultant structure may be annealed at a temperature of about 150° C. to about 450° C.

Referring to FIG. 11F, the resulting structure, including the metal layer 32P shown in FIG. 11E, may be polished by a chemical mechanical polishing (CMP) process to expose the first polish stop layer 135.

As shown in FIG. 11F, this polishing step may remove portions of the via insulating layer 40, the conductive barrier layer 34, and the metal layer 32P that are outside the via hole 22. The portion of the metal layer 32P that remains in the via hole 22 becomes the conductive plug 32 on the conductive barrier layer 34.

Referring to FIG. 11G, the structure shown in FIG. 11F is thermally treated. During this thermal treatment, metal particles may grow from the exposed portion of the conductive plug 32 and thus a surface roughness of the exposed surface of the conductive plug 32 may be degraded.

A second CMP process may be performed to remove the metal particles that protrude outside the via hole 22. The first polish stop layer 135 (see FIG. 11G) may also be removed by the second CMP process so that an upper surface of the interlayer insulating layer 134 of the FEOL structure 130 may be exposed. In some embodiments, the above-discussed thermal treatment may be performed at a temperature of about 400° C. to about 500° C.

The TSV structure 30 that includes the conductive plug 32 and the conductive barrier layer 34 surrounding the conductive plug 32, remains in the via hole 22.

Referring to FIG. 11H, the structure shown in FIG. 11G may be cleaned, and then, a second polish stop layer 148A, an insulating layer 148B, and a third polish stop layer 148C may be sequentially formed on the interlayer insulating layer 134 and may be patterned to form a metal wiring hole 148H that exposes the upper surface of the TSV structure 30 and a peripheral portion of the TSV structure 30 at an inlet side of the via hole 22.

The second polish stop layer 148A may be used as an etch stop layer when the metal wiring hole 148H is formed.

Portions of the TSV structure 30, the via insulating layer 40, and the interlayer insulating layer 134 may be exposed through the metal wiring hole 148H. In other embodiments, the metal wiring hole 148H may be formed so that only the upper surface of the TSV structure 30 may be exposed through the metal wiring hole 148H.

In some embodiments, the insulating layer 148B may be formed of tetra-ethyl-ortho-silicate (TEOS). The second and third polish stop layers 148A and 148C may be formed as silicon nitride layers or silicon oxynitride layers. The thicknesses of the second polish stop layer 148A, the insulating layer 148B, and the third polish stop layer 148C may be arbitrarily determined.

Referring to FIG. 11I, the metal wiring layer 142 is formed in the metal wiring hole 148H.

The metal wiring layer 142 may comprise a wiring barrier layer 142A and a wiring metal layer 142B that are sequentially stacked.

In some embodiments, in order to form the metal wiring layer 142, a first layer for forming the wiring barrier layer 142A and a second layer for forming the wiring metal layer 142B are sequentially formed in the metal wiring hole 148H and on the third polish stop layer 148C (see FIG. 11H), and then, the resulting structure is polished through a CMP process using the third polish stop layer 148C as a polish stop layer. The third polish stop layer 148C may be removed by the CMP process to expose an upper surface of the insulating layer 148B. The metal wiring layer 142, including the wiring barrier layer 142A and the wiring metal layer 142B, remains in the metal wiring hole 148H (see FIG. 11H).

In some embodiments, the wiring barrier layer 142A may include at least one material selected from the group consisting of Ti, TiN, Ta, and TaN. The wiring barrier layer 142A may be formed to a thickness of about 1000 Å to about 1500 Å by a PVD process.

The wiring metal layer 142B may include Cu. In order to form the wiring metal layer 142B, a Cu seed layer may be formed on a surface of the wiring barrier layer 142A, and then, a Cu layer may be grown from the Cu seed layer by an electroplating process. The resulting structure may then be annealed.

Referring to FIG. 11J, similar to the process of forming the metal wiring layer 142 described above with reference to FIGS. 11H and 11I, a contact plug 144 having the same stack structure as that of the metal wiring layer 142 is formed on the metal wiring layer 142. After that, the process of forming the metal wiring layer 142 described with reference to FIGS. 11H and 11I and the process of forming the contact plug 144 may be performed multiple times to form a multi-layered wiring structure 146 that includes a plurality of metal wiring layers 142 and a plurality of contact plugs 144 that are alternately connected. A bonding pad 152 may be formed that is connected to the multi-layered wiring structure 146.

In the illustrated embodiment, the multi-layered wiring structure 146 includes two metal wiring layers 142 and two contact plugs 144, but embodiments of the inventive concepts are not limited thereto. Also, connecting structures of the metal wiring layers 142 and the contact plugs 144 in the multi-layered wiring structure 146 of FIG. 11J are examples, and thus it will be appreciated that embodiments of the inventive concepts are not limited to the example connecting structure of FIG. 11J.

In some embodiments, each of the metal wiring layers 142 and each of the contact plugs 144 may include at least one metal selected from the group consisting of W, Al, and Cu. The metal wiring layers 142 may be formed of the same material as the contact plugs 144. In another exemplary embodiment, at least some of the metal wiring layers 142 may include different materials than the contact plugs 144.

When forming the multi-layered wiring structure 146, other multi-layered wiring structures (not shown) that likewise include metal wiring layers and contact plugs may be formed simultaneously on other regions of the substrate 120. Thus, the BEOL structure 140 including the inter-metal insulating layer 148 a plurality of second polish stop layers 148A, a plurality of insulating layers 148B (refer to FIG. 11J) and a plurality of multi-layered wiring structures including the portions insulated by the inter-metal insulating layer 148 may be formed on the FEOL structure 130. The BEOL structure 140 may include a plurality of wiring structures for connecting individual devices included in the FEOL structure 130 to other wires formed on the substrate 120. In some embodiments, the BEOL structure 140 may further include a seal ring for protecting the wiring structures and other structures under the wiring structures against external shock or moisture.

Referring to FIG. 11K, an upper insulating layer 150 is formed and a hole 150H that exposes the bonding pad 152 is formed in the upper insulating layer 150. An upper connection terminal 154 is formed on the upper insulating layer 150 and connected to the bonding pad 152 via the hole 150H.

The upper insulating layer 150 may be a silicon oxide layer, a silicon nitride layer, a polymer, or a combination thereof.

Referring to FIG. 11L, a bottom portion of the substrate 120 is removed so that the TSV structure 130 surrounded by the via insulating layer 40 may protrude from a bottom surface 120B of the remaining portion of the substrate 120.

Referring to FIG. 11M, a lower insulating layer 122 is formed on the bottom surface 120B of the substrate 120. The lower insulating layer 122 may cover the bottom surface 120B of the substrate 120 and the via insulating layer 40 that protrudes from the bottom surface 120B of the substrate 120.

In some embodiments, the lower insulating layer 122 may be formed by a CVD process. The lower insulating layer 122 may comprise, for example, a silicon oxide layer, a silicon nitride layer, or a polymer.

Referring to FIG. 11N, a polishing process is performed on the exposed surface of the lower insulating layer 122 until a planarized surface is obtained at the bottom surface 120B of the substrate 120. This polishing process may expose a bottom surface 30B of the TSV structure 30.

Referring to FIG. 11O, the second conductive layer 64 that is connected to the TSV structure 30 on the bottom surface 120B of the substrate 120, the connection terminal 70 that is connected to the bottom surface 30B of the TSV structure 30 via the second conductive layer 64, and the metal capping layer 80 that covers the connection terminal 70 are formed via the processes that are described above with reference to FIGS. 9A to 9E. The metal capping layer 80 includes the flat capping portion 80A that covers the lower surface 70T of the connection terminal 70, and the wedge-shaped capping portion 80B that partially cover the side walls 70S of the connection terminal 70.

The method of manufacturing the integrated circuit device 100A exemplarily shown in FIG. 2 is described above with reference to FIGS. 11A to 11O; however, it will be apparent that the integrated circuit device 100B shown in FIG. 3 and the integrated circuit device 100C shown in FIG. 4 may be also manufactured by the method described with reference to FIGS. 11A to 11O.

As described above, pursuant to embodiments of the inventive concepts, when the metal capping layer 80 is formed on the connection terminal 70, an electroplating process is performed while applying a pulse-type current using a metal strike plating solution so as to form a metal capping layer 80 having a uniform film quality having reduced thickness variation. Therefore, oxidation or degradation of the lower surface of the connection terminal 70, which is covered by the metal capping layer 80, may be reduced or prevented. In addition, defects caused by the oxidation or the degradation of the connection terminal 70 when bonding the connection terminal 70 to a bonding member such as a solder in order to connect the connection terminal 70 to another chip may be reduced or prevented, and thus, the reliability of the integrated circuit device may be improved.

Figure 12:
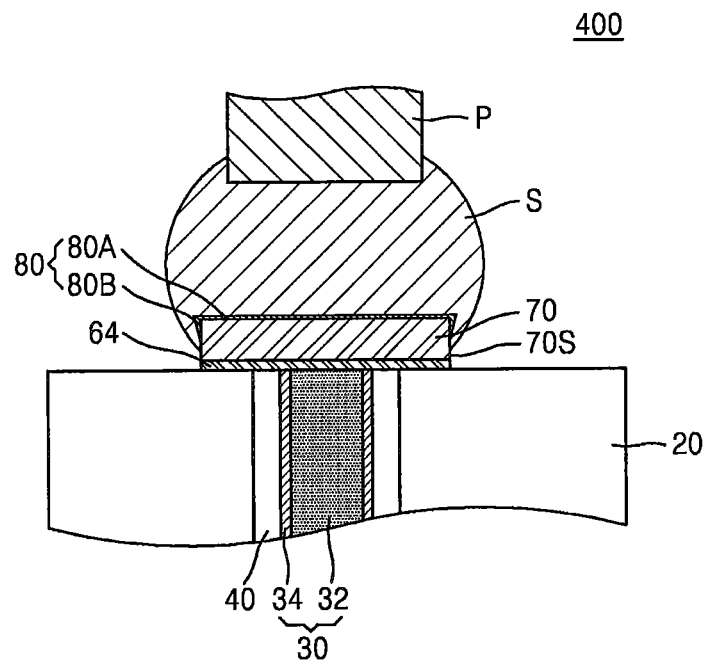
FIG. 12 is a cross-sectional view of an integrated circuit device according to an exemplary embodiment of the inventive concepts.

FIG. 12 is a cross-sectional view of an integrated circuit device 400 according to another embodiment of the inventive concepts. In FIG. 12, like reference numerals as those of FIG. 1 denote the same elements, and detailed descriptions thereof are omitted herein.

Referring to FIG. 12, in the integrated circuit device 400, the integrated circuit device 10 of FIG. 1 is connected to a side of a solder ball S via the connection terminal 70 and the metal capping layer 80. The other side of the solder ball S is connected to a conductive pillar P. The solder ball S may be electrically connected to another integrated circuit device or package via the conductive pillar P.

In the integrated circuit device 400, an external surface of the metal capping layer 80, which faces a direction opposite the connection terminal 70, is surrounded by the solder ball S. The solder ball S surrounds the wedge-shaped capping portions 80B formed on the side walls 70S of the connection terminal 70, and also extends to portions of the side walls 70S which are not covered by the wedge-shaped capping portions 80B.

Therefore, in a state where the integrated circuit device 10 is connected to the solder ball S via the connection terminal 70 and the metal capping layer 80, the metal capping layer 80 may not be exposed.

In FIG. 12, a case in which the integrated circuit device 10 is connected to the solder ball S via the connection terminal 70 and the metal capping layer 80 is described as an example, but the structure described with reference to FIG. 12 may be obtained using the integrated circuit device 100A shown in FIG. 2, the integrated circuit device 100B shown in FIG. 3, and the integrated circuit device 100C shown in FIG. 4, instead of using the integrated circuit device 10.

Figure 13:
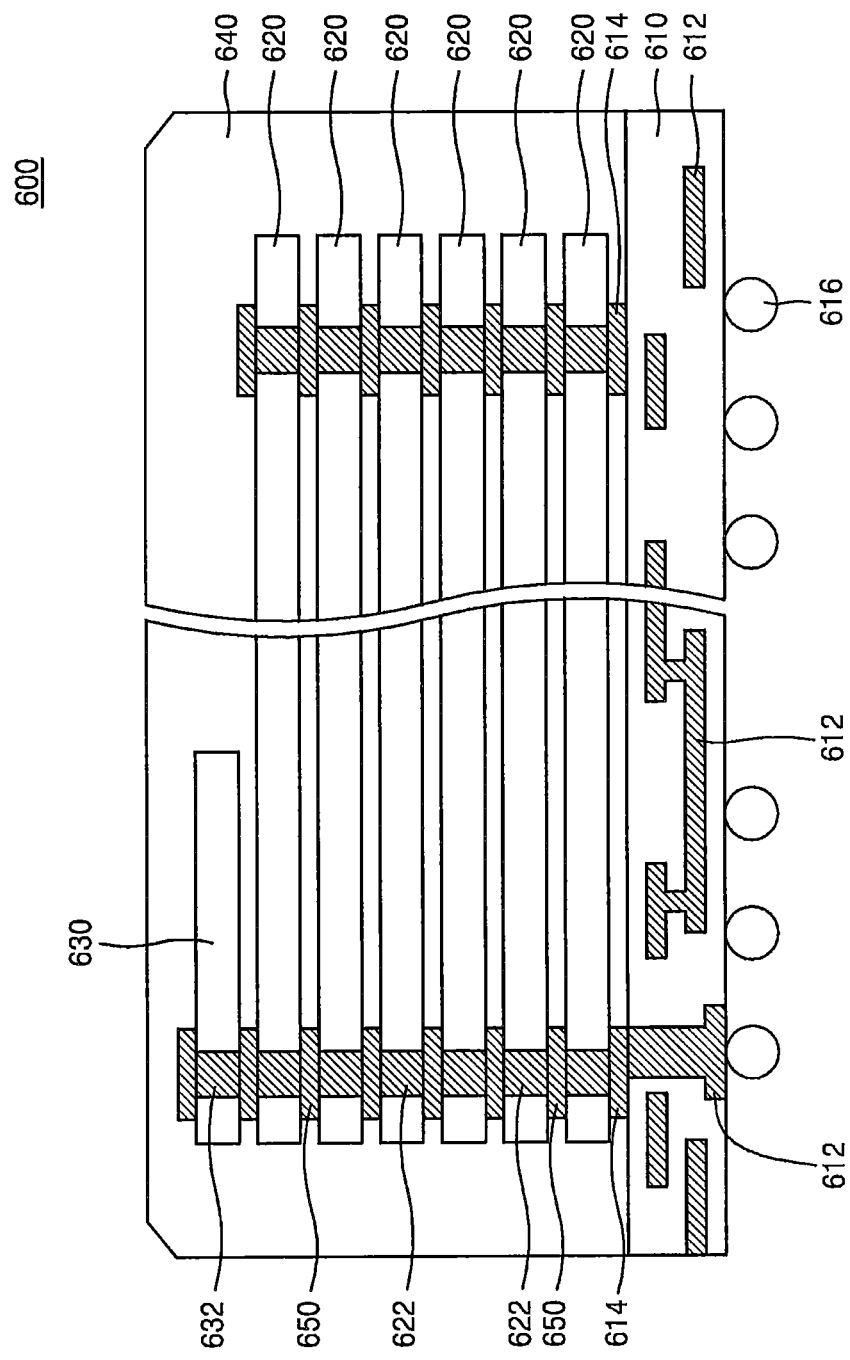
FIG. 13 is a cross-sectional view of a semiconductor package according to an exemplary embodiment of the inventive concepts.

FIG. 13 is a cross-sectional view showing main elements of a semiconductor package 600 according to another exemplary embodiment of the inventive concepts.

Referring to FIG. 13, the semiconductor package 600 includes a plurality of semiconductor chips 620 that are sequentially stacked on a package substrate 610. A control chip 630 is connected to the plurality of semiconductor chips 620. The stacked structure including the plurality of semiconductor chips 620 and the control chip 630, is sealed by an encapsulant 640 such as thermosetting resin on the package substrate 610. In FIG. 13, six semiconductor chips 620 are vertically stacked, but the number of semiconductor chips 620 and the direction in which the semiconductor chips 620 are stacked are not limited thereto. The number of semiconductor chips 620 may be less or greater than six. The plurality of semiconductor chips 620 may be arranged in a horizontal direction on the package substrate 610, or may be arranged in a direction combining the vertical and horizontal directions. In one or more exemplary embodiments, the control chip 630 may be omitted.

The package substrate 610 may be, for example, a flexible printed circuit board, a rigid printed circuit board, or a combination thereof. The package substrate 610 may include internal wires 612 and connection terminals 614. The connection terminals 614 may be formed on a surface of the package substrate 610. One or more solder balls 616 may be formed on another surface of the package substrate 610. The connection terminals 614 are electrically connected to the solder balls 616 via the internal wires 612. In some embodiments, the solder balls 616 may be replaced with conductive bumps or a lead grid array (LGA).

The semiconductor chips 620 and the control chip 630 include TSV units 622 and 632. The TSV units 622 and 632 may be electrically connected to the connection terminals 614 of the package substrate 61Q via connection members 650 such as bumps. In some embodiments, the TSV unit 632 may be omitted.

At least one of the semiconductor chips 620 and/or the control chip 630 may include at least one selected from the group consisting of the integrated circuit devices 10, 100A, 100B, and 100C described above with reference to FIGS. 1 to 4. In addition, each of the TSV units 622 and 632 includes the TSV structure 30 described above with reference to FIGS. 1 to 4. The connection members 650 include the second conductive layer 64 described with reference to FIGS. 1 to 4, the connection terminal 70 that is connected to the TSV units 622 and 632 via the second conductive layer 64, and the metal capping layer 80 that covers the connection terminal 70. The metal capping layer 80 includes the flat capping portion 80A that covers the lower surface 70T of the connection terminal 70, and the wedge-shaped capping portions 80B that are integrally connected to the flat capping portion 80A and that partially cover the side walls 70S of the connection terminal 70.

Each of the semiconductor chips 620 may include a system large scale integration (LSI) memory, flash memory, dynamic random access memory (DRAM), static RAM (SRAM), electrically erasable programmable read-only memory (EEPROM), parameter RAM (PRAM), magnetic RAM (MRAM), or resistive RAM (RRAM). The control chip 630 may include logic circuits such as serializer/deserializer (SER/DES).

Figure 14:
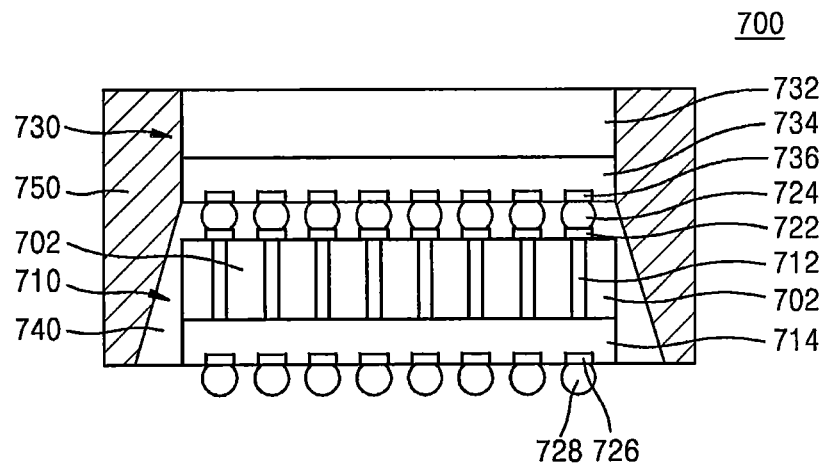
FIG. 14 is a cross-sectional view of a semiconductor package according to another exemplary embodiment of the inventive concepts.

FIG. 14 is a cross-sectional view of a semiconductor package 700 according to another embodiment of the inventive concepts.

Referring to FIG. 14, the semiconductor package 700 includes a first chip 710, a second chip 730, an underfill 740, and an encapsulant 750.

The first chip 710 may have a structure of one of the integrated circuit devices 10, 100A, 100B, and 100C described above with reference to FIGS. 1 to 4.

The first chip 710 includes a plurality of TSV units 712 that penetrate through a semiconductor structure 702. Each of the plurality of TSV units 712 may include the TSV structure 30 described above with reference to FIGS. 1 to 4.

The semiconductor structure 702 may include the semiconductor structure 20 shown in FIG. 1, or the substrate 120 shown in FIGS. 2 to 4.

In some embodiments, the first chip 710 has the structure of the integrated circuit device 100A shown in FIG. 2, and a device layer 714 of the first chip 710 may correspond to the BEOL structure 140 shown in FIG. 2. In another exemplary embodiment, the first chip 710 may have the structure of the integrated circuit device 100C shown in FIG. 4, and the device layer 714 may correspond to the stacked structure of the FEOL structure 130 and the BEOL structure 140 shown in FIG. 4. In another exemplary embodiment, the first chip 710 may have the structure of the integrated circuit device 100B shown in FIG. 3, and the device layer 714 may be omitted.

An upper pad 722 and connection terminal 724 that are connected to ends of each of the plurality of TSV units 712 may be disposed at a side of the first chip 710. In addition, an electrode pad 726 and a connection terminal 728 may be connected to the other side of the first chip 710. The connection terminals 724 and 728 may include solder balls or bumps.

At least one of the upper pad 722 and the electrode pad 726 may include the second conductive layer 64 that is described above with reference to FIGS. 1 to 4, the connection terminal 70 that is connected to the TSV units 712 via the second conductive layer 64, and the metal capping layer 80 that covers the connection terminal 70. The metal capping layer 80 includes the flat capping portion 80A that covers the lower surface 70T of the connection terminal 70, and the wedge-shaped capping portions 80B that are connected integrally to the flat capping portion 80A and that partially covers the side walls 70S of the connection terminal 70.

The second chip 730 may include a substrate 732 and a wiring structure 734 that is formed on the substrate 732. An integrated circuit layer may be further formed on the substrate 732. The second chip 730 may not include a TSV structure. An electrode pad 736 may be connected to the wiring structure 734. The wiring structure 734 may be connected to the TSV units 712 via the electrode pad 736, the connection terminal 724, and the upper pad 722.

The underfill 740 may fill a connection portion between the first chip 710 and the second chip 730, that is, a portion where the connection terminal 724 of the first chip 710 and the electrode pad 736 of the second chip 730 are connected to each other. The underfill 740 may be formed of epoxy resin, and may include a silica filler or a flux. The underfill 740 may be formed of a material that is the same as or different from a material forming the encapsulant 750 formed on an outer side of the underfill 740.

The underfill 740 is formed to surround the connection portion between the first chip 710 and the second chip 730, and side surfaces of the first chip 710 so that the side surfaces of the first chip 710 may be sealed by the underfill 740.

In FIG. 14, the underfill 740 may have a shape that widens with increasing distance from the second chip 730. However, the shape of the underfill 740 is not limited thereto. For example, the underfill 740 may not surround the side surfaces of the first chip 710, and may be formed only in a space between the first chip 710 and the second chip 730.

The encapsulant 750 seals the first chip 710 and the second chip 730. The encapsulant 750 may be formed of a polymer, for example, an EMC. The encapsulant 750 may seal side surfaces of the second chip 730 and the underfill 740. In some embodiments, if the underfill 740 is formed only in the space between the first chip 710 and the second chip 730, the encapsulant 750 may seal the side surfaces of the first chip 710.

An upper surface of the second chip 730 may not be sealed by the encapsulant 750, but may be exposed to the outside.

Figure 15:
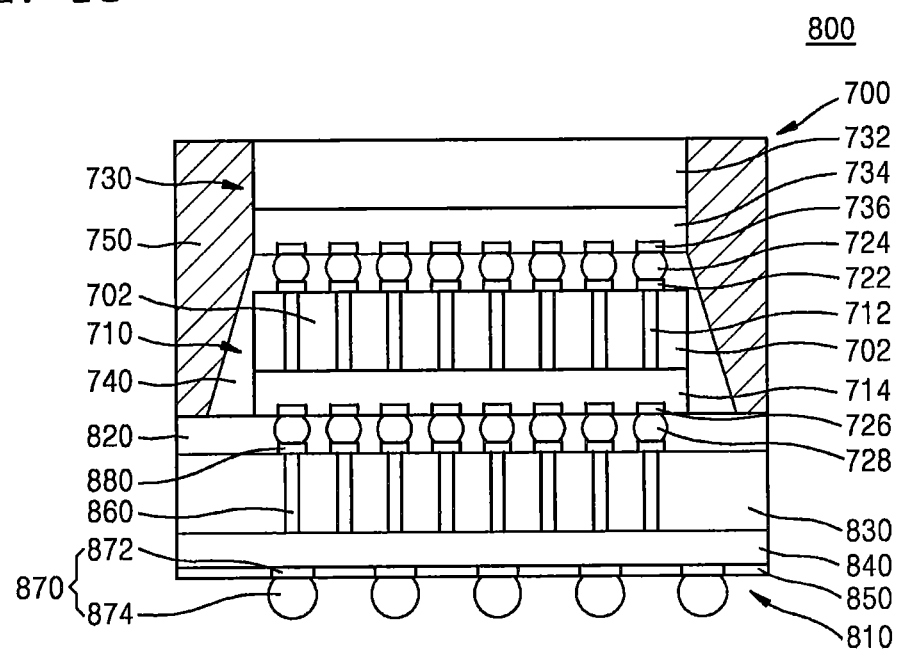
FIG. 15 is a cross-sectional view of a semiconductor package according to still another exemplary embodiment of the inventive concepts.

FIG. 15 is a cross-sectional view of a semiconductor package 800 according to yet another embodiment of the inventive concepts. In FIG. 15, like reference numerals as those of FIG. 14, and detailed descriptions thereof are not provided.

Referring to FIG. 15, the semiconductor package 800 includes a main chip 810 and the semiconductor package 700 mounted on the main chip 810.

The semiconductor package 700 is described above with reference to FIG. 14, and thus, detailed descriptions thereof are not provided.

The main chip 810 may have a horizontal cross-section, an area of which is greater than those of the first chip 710 and the second chip 730 included in the semiconductor package 700. In some embodiments, the horizontal cross-section area of the main chip 810 may be equal to a horizontal cross-section area of the semiconductor package 700 including the encapsulant 750. The semiconductor package 700 may be mounted on the main chip 810 via an adhesive member 820. In addition, bottom surfaces of the encapsulant 750 and the underfill 740 in the semiconductor package 700 may be attached on a boundary of an upper surface of the main chip 810 using the adhesive member 820.

The main chip 810 may include a body layer 830, a lower insulating layer 840, a passivation layer 850, a plurality of TSV units 860 that penetrate through the body layer 830, a plurality of connection terminals 870, and an upper pad 880.

Each of the TSV units 860 may include the TSV structure 30 described above with reference to FIGS. 1 to 4.

An integrated circuit layer and a multi-layered wiring pattern may be included in each of the body layer 830 and the lower insulating layer 840. The integrated circuit layer and the multi-layered wiring pattern may vary depending on the type of the main chip 810. The main chip 810 may form a logic chip, for example, a central processing unit (CPU), a controller, or an application specific integrated circuit (ASIC).

In FIG. 15, the semiconductor package 700 is stacked on the main chip 810, but the semiconductor package 700 may be mounted on a support substrate such as a printed circuit board (PCB), or directly on the package substrate.

Each of the connection terminals 870 are formed on a lower portion the main chip 810 and may include a pad 872 and a solder ball 874. The connection terminals 870 formed on the main chip 810 may be larger than the connection terminals 728 that are formed on the semiconductor package 700.

Figure 16:
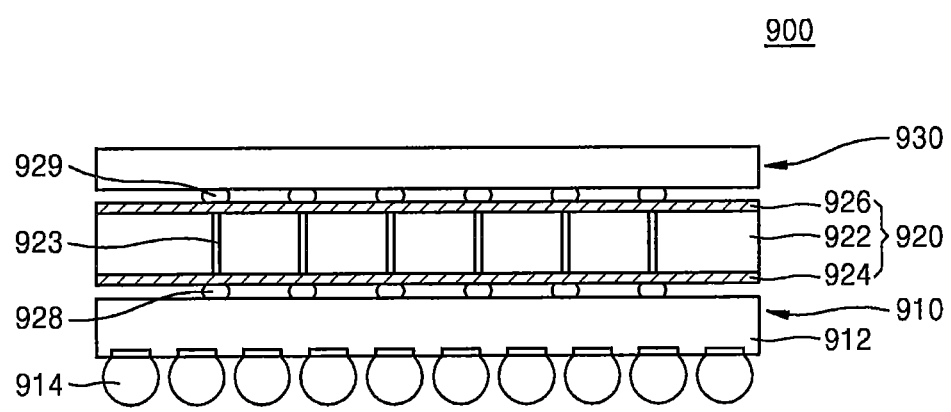
FIG. 16 is a cross-sectional view of a semiconductor package according to yet another exemplary embodiment of the inventive concepts.

FIG. 16 is a cross-sectional view of a semiconductor package 900 according to still another embodiment of the inventive concepts. In FIG. 16, the semiconductor package 900 is formed as a package on package (POP), in which a lower semiconductor package 910 and an upper semiconductor package 930 are flip-chip bonded to an interposer 920 that has a TSV structure.

Referring to FIG. 16, the semiconductor package 900 includes the lower semiconductor package 910, the interposer 920 including a plurality of TSV units 923 therein, and the upper semiconductor package 930.

Each of the TSV units 923 may include the TSV structure 30 described above with reference to FIGS. 1 to 4.

A plurality of first connection terminals 914 are attached to a lower portion of a substrate 912 of the lower semiconductor package 910. The first connection terminals 914 may be used to connect the semiconductor package 900 to a main PCB of an electronic device. In some embodiments, the first connection terminals 914 may be formed of solder balls or other solder structures.

The interposer 920 is used to form vertical connection terminals at fine pitches, where the vertical connection terminals connect the lower semiconductor package 910 and the upper semiconductor package 930 together. By using the interposer 920, a planar area of a POP integrated device may be reduced. The interposer 920 may include a silicon layer 922, that the plurality of TSV units 923 penetrate, and redistribution layers 924 and 926 respectively formed on a bottom surface and an upper surface of the silicon layer 922 to redistribute the plurality of TSV units 923.

In some embodiments, at least one of the redistribution layers 924 and 926 may include the second conductive layer 64 described above with reference to FIGS. 1 to 4, the connection terminal 70 that is connected to the TSV units 923 via the second conductive layer 64, and the metal capping layer 80 that covers the connection terminal 70. The metal capping layer 80 includes the flat capping portion 80A that covers the lower surface 70T of the connection terminal 70, and the wedge-shaped capping portion 80B that are integrally connected to the flat capping portion 80A and partially covering the respective side walls 70S of the connection terminal 70.

In some embodiments, at least one of the redistribution layers 924 and 926 may be omitted.

A plurality of second connection terminals 928 that connect the TSV units 923 and the substrate 912 of the lower semiconductor package 910 to each other are formed on a bottom surface of the interposer 920. A plurality of third connection terminals 929 that connect the TSV units 923 and the upper semiconductor package 930 to each other are formed on an upper surface of the interposer 920. In some embodiments, each of the second connection terminals 928 and the third connection terminals 929 may be formed of a solder bump or another solder structure.

If the semiconductor package 900 is a semiconductor device used in a mobile phone, the lower semiconductor package 910 may be a logic device such as a processor and the upper semiconductor package 930 may be a memory device.

In some embodiments, the upper semiconductor package 930 may be a multi-chip package in which a plurality of semiconductor chips (not shown) are stacked, and an upper portion of the upper semiconductor package 930 may be sealed by an encapsulant (not shown).

Figure 17:
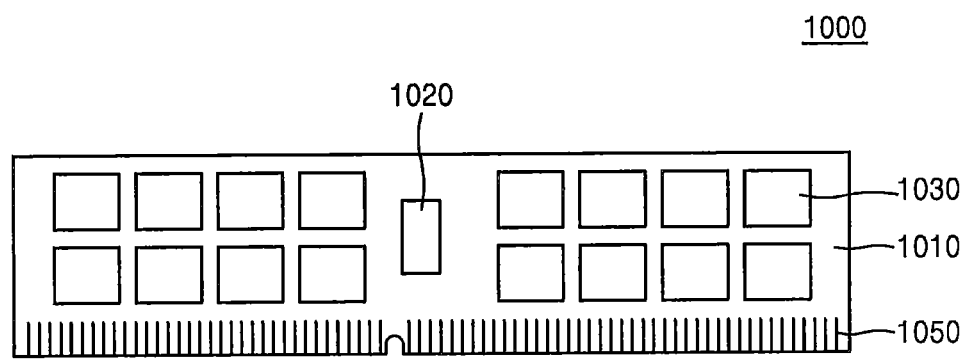
FIG. 17 is a plan view showing main elements of an integrated circuit device according to an exemplary embodiment of the inventive concepts.

FIG. 17 is a plan view showing main elements of an integrated circuit device 1000 according to another exemplary embodiment of the inventive concepts.

The integrated circuit device 1000 includes a module substrate 1010, a control chip 1020 mounted on the module substrate 1010, and a plurality of semiconductor packages 1030. A plurality of input/output terminals 1150 are formed on the module substrate 1010.

The plurality of semiconductor packages 1030 may respectively include at least one selected from the group consisting of the integrated circuit devices 10, 100A, 100B, and 100C described above with reference to FIGS. 1 to 4.

Figure 18:
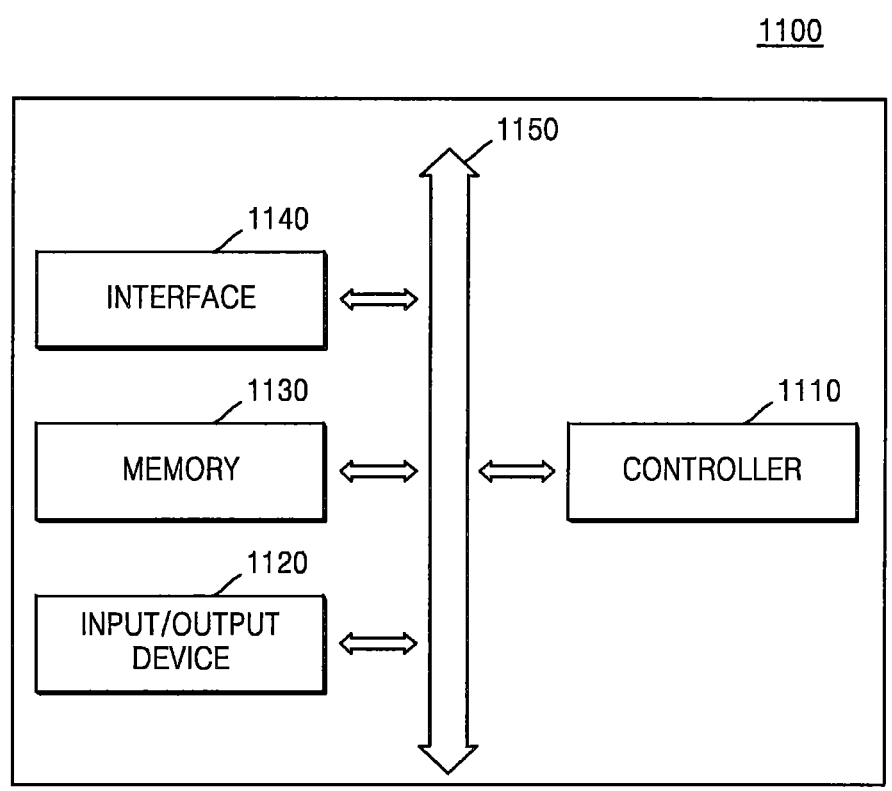
FIG. 18 is a diagram showing main elements of an integrated circuit device according to an exemplary embodiment of the inventive concepts.

FIG. 18 is a block diagram of an integrated circuit device 1100 according to still another embodiment of the inventive concepts.

The integrated circuit device 1100 includes a controller 1110, an input/output device 1120, a memory 1130, and an interface 1140. The integrated circuit device 1100 may be a mobile system or a system for transmitting or receiving information. In some embodiments, the mobile system may be at least one selected from the group consisting of a personal digital assistant (PDA), a portable computer, a web tablet, a wireless phone, a mobile phone, a digital music player, and a memory card.

The controller 1110 may be a microprocessor, a digital signal processor, or a micro-controller.

The input/output device 1120 is used to input/output data to/from the integrated circuit device 1100. The integrated circuit device 1100 may be connected to an external device, for example, a personal computer or a network, by using the input/output device 1120, and may exchange data with the external device. In some embodiments, the input/output device 1120 may be a keypad, a keyboard, or a display.

The memory 1130 stores code and/or data for operating the controller 1110. Otherwise, the memory 1130 may store data processed by the controller 1110. At least one of the controller 1110 and the memory 1130 may include at least one selected from the group consisting of the integrated circuit devices 10, 100A, 100B, and 100C described above with reference to FIGS. 1 to 4.

The interface 1140 functions as a data transmission path between the integrated circuit device 1100 and an external device. The controller 1110, the input/output device 1120, the memory 1130, and the interface 1140 communicate with each other via a bus 1150.

The integrated circuit device 1100 may be included in a mobile phone, an MP3 player, a navigation system, a portable multimedia player (PMP), a solid state disk (SSD), or a home appliance.

While the inventive concepts has been particularly shown and described with reference to exemplary embodiments thereof, it will be understood that various changes in form and details may be made therein without departing from the spirit and scope of the following claims.

What is claimed is:

1. An integrated circuit device comprising:
a semiconductor structure;
a through-silicon-via (TSV) structure that extends in a first direction and that penetrates through the semiconductor structure;
a connection terminal on the semiconductor structure, the connection terminal including an upper surface that is electrically connected to the TSV structure, a bottom surface that is opposite the upper surface, and a side wall that extends between the bottom surface and the upper surface;
a metal capping layer that includes a flat capping portion that covers the bottom surface of the connection terminal, and a wedge-shaped capping portion that is integrally connected to the flat capping portion and that partially covers the side wall of the connection terminal; and
a solder structure that surrounds the metal capping layer on the connection terminal,
wherein the solder structure extends to cover a portion of the side wall of the connection terminal that is not covered by the wedge-shaped capping portion, while surrounding the wedge-shaped capping portion.

2. The integrated circuit device of claim 1, wherein the entirety of the metal capping layer is formed of the same material, and wherein the wedge-shaped capping portion has a thickness that decreases with increasing distance from the bottom surface of the connection terminal.

3. The integrated circuit device of claim 1, wherein the flat capping portion of the metal capping layer has a thickness in the first direction of about 0.05 μm to about 0.5 μm.

4. The integrated circuit device of claim 1, wherein the portion of the flat capping portion of the metal capping layer that contacts the bottom surface of the connection terminal has a thickness variation within ±3%.

5. The integrated circuit device of claim 1, wherein the metal capping layer comprises a precious metal.

6. The integrated circuit device of claim 1, wherein the connection terminal comprises a conductive pad, a solder ball, a solder bump, or a redistribution conductive layer.

7. The integrated circuit device of claim 1, wherein the connection terminal comprises Ni, Cu, Al, or a combination thereof.

8. The integrated circuit device of claim 1, further comprising a metal layer that comprises Ti, Cu, Ni, Au, NiV, NiP, TiNi, TiW, TaN, Al, Pd, CuCr, or a combination thereof between the TSV structure and the connection terminal.

9. The integrated circuit device of claim 1, wherein the semiconductor structure comprises a substrate and an interlayer insulating layer that covers the substrate, and the TSV structure penetrates through the substrate but does not fully penetrate the interlayer insulating layer.

10. The integrated circuit device of claim 1, wherein the semiconductor structure comprises a substrate, an interlayer insulating layer that covers the substrate, and an inter-metal insulating layer that covers the interlayer insulating layer, and the TSV structure penetrates through the substrate, the interlayer insulating layer, and the inter-metal insulating layer.

11. The integrated circuit device of claim 1, wherein the wedge-shaped capping portion covers no more than half a length of the side wall of the connection terminal.

12. The integrated circuit device of claim 1, wherein the side wall of the connection terminal extends upwardly at a right angle from the bottom surface of the connection terminal and meets the upper surface of the connection terminal at a right angle.

13. An integrated circuit device comprising:
a semiconductor structure;
a through-silicon-via (TSV) structure that extends in a first direction and that penetrates through the semiconductor structure;
a connection terminal on the semiconductor structure, the connection terminal including an upper surface that is electrically connected to the TSV structure, a bottom surface that is opposite the upper surface, and a side wall that extends between the bottom surface and the upper surface; and
a metal capping layer that includes a flat capping portion that covers the bottom surface of the connection terminal, and a wedge-shaped capping portion that is integrally connected to the flat capping portion and that partially covers the side wall of the connection terminal,
wherein the side wall of the connection terminal has a first length, and a side of the wedge-shaped capping portion that partially covers the side wall of the connection terminal has a second length that is less than or equal to half the first length.

14. The integrated circuit device of claim 13, wherein the second length is in a range of about 0.1 μm to about 3 μm.

15. The integrated circuit device of claim 13, further comprising a solder ball that surrounds the wedge-shaped capping portion, wherein the solder ball directly contacts the side wall of the connection terminal.

16. An integrated circuit device comprising:
a semiconductor structure that includes a through-silicon-via (TSV) structure;
a connection terminal that is electrically connected to the TSV structure that has a bottom surface, an upper surface that is opposite the bottom surface, and a side wall that extends between the bottom surface and the upper surface; and
a metal capping layer that includes a flat capping portion that is on the bottom surface of the connection terminal and a wedge-shaped capping portion that is integrally connected to the flat capping portion and that extends onto the side wall of the connection terminal,
wherein the wedge-shaped capping portion covers no more than half the length of the side wall of the connection terminal.

17. The integrated circuit device of claim 16, further comprising a metal layer between the TSV structure and the connection terminal.

18. The integrated circuit device of claim 17, wherein the connection terminal is on a bottom surface of the metal layer and the metal capping layer is on a bottom surface of the connection terminal, and wherein the portion of the flat capping portion of the metal capping layer that contacts the bottom surface of the connection terminal has a thickness variation within ±3%.

19. The integrated circuit device of claim 16, further comprising a solder ball that surrounds the wedge-shaped capping portion, wherein the solder ball directly contacts the side wall of the connection terminal.

20. The integrated circuit device of claim 16, wherein the side wall of the connection terminal extends upwardly at a right angle from the bottom surface of the connection terminal and meets the upper surface of the connection terminal at a right angle.

* * * * *